United States Patent
Cox et al.

(10) Patent No.: US 11,335,395 B2
(45) Date of Patent: *May 17, 2022

(54) APPLYING CHIP SELECT FOR MEMORY DEVICE IDENTIFICATION AND POWER MANAGEMENT CONTROL

(71) Applicant: Intel Corporation, Santa Clara, CA (US)

(72) Inventors: Christopher E. Cox, Placerville, CA (US); Kuljit S. Bains, Olympia, WA (US); Christopher P. Mozak, Portland, OR (US); James A. McCall, Portland, OR (US); Akshith Vasanth, Folsom, CA (US); Bill Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/062,420

(22) Filed: Oct. 2, 2020

(65) Prior Publication Data

US 2021/0020224 A1    Jan. 21, 2021

Related U.S. Application Data

(63) Continuation of application No. 16/340,084, filed as application No. PCT/US2017/059102 on Oct. 30, 2017, now Pat. No. 10,839,887.

(Continued)

(51) Int. Cl.
*G11C 11/4072* (2006.01)
*G11C 11/4096* (2006.01)
(Continued)

(52) U.S. Cl.
CPC ...... *G11C 11/4072* (2013.01); *G11C 11/4074* (2013.01); *G11C 11/4076* (2013.01);
(Continued)

(58) Field of Classification Search
CPC ............ G11C 11/4072; G11C 11/4096; G11C 11/4093; G11C 11/4076; G11C 11/4074;
(Continued)

(56) References Cited

U.S. PATENT DOCUMENTS 5,930,177 A    7/1999    Kim
6,088,290 A    7/2000    Ohtake et al.
(Continued)

FOREIGN PATENT DOCUMENTS

| KR | 19990038916 A | * | 6/1999 | ........... G11C 7/1072 |
| KR | 100269313 B1 | * | 12/2000 | ........... G11C 7/1045 |
| WO | WO-2013141851 A1 | * | 9/2013 | ........... G06F 3/0629 |

OTHER PUBLICATIONS

Extended European Search Report for Patent Application No. 17864379.7, dated May 4, 2020, 7 pages.

(Continued)

*Primary Examiner* — Steven G Snyder
(74) *Attorney, Agent, or Firm* — Compass IP Law PC

(57) ABSTRACT

A memory subsystem triggers entry and exit of a memory device from low power mode with a chip select (CS) signal line. For a system where the command bus has no clock enable (CKE) signal line, the system can trigger low power modes with CS instead of CKE. The low power mode can include a powerdown state. The low power mode can include a self-refresh state. The memory device includes an interface to the command bus, and receives a CS signal combined with command encoding on the command bus to trigger a low power mode state change. The memory device can be configured to monitor the CS signal and selected (Continued)

other command signals while in low power mode. The system can send an ODT trigger while the memory device is in low power mode, even without a dedicated ODT signal line.

19 Claims, 12 Drawing Sheets

Related U.S. Application Data

(60) Provisional application No. 62/415,443, filed on Oct. 31, 2016.

(51) Int. Cl.
*G11C 11/4076* (2006.01)
*G11C 11/4093* (2006.01)
*G11C 11/4074* (2006.01)
*G11C 11/406* (2006.01)

(52) U.S. Cl.
CPC ...... *G11C 11/4093* (2013.01); *G11C 11/4096* (2013.01); *G11C 11/40615* (2013.01)

(58) Field of Classification Search
CPC ............ G11C 11/40615; G11C 7/1057; G11C 7/1084; G11C 7/225; G11C 2207/2227
See application file for complete search history.

(56) References Cited

U.S. PATENT DOCUMENTS

| | | | | |
|---|---|---|---|---|
| 7,394,712 B2* | 7/2008 | Do | ................... | G11C 11/40615 365/189.05 |
| 7,636,269 B2* | 12/2009 | Do | ................... | G11C 11/40615 365/189.05 |
| 9,087,568 B1* | 7/2015 | Ware | ........................ | G11C 7/22 |
| 9,223,718 B2* | 12/2015 | Vogt | ........................ | G06F 3/0604 |
| 9,652,170 B2* | 5/2017 | Vogt | ........................ | G06F 3/0679 |
| 9,792,974 B2* | 10/2017 | Ha | ..................... | G11C 11/40615 |
| 10,109,341 B2* | 10/2018 | Hsieh | ................... | G11C 11/4072 |
| 2003/0210600 A1 | 11/2003 | Koo et al. | | |
| 2005/0286339 A1* | 12/2005 | Parris | ..................... | G11C 5/144 365/236 |
| 2006/0250876 A1 | 11/2006 | Horiguchi et al. | | |
| 2007/0253270 A1* | 11/2007 | Do | ........................ | G11C 11/406 365/222 |
| 2008/0239855 A1* | 10/2008 | Do | .................... | G11C 11/40615 365/222 |
| 2013/0297863 A1* | 11/2013 | Vogt | ........................ | G11C 7/225 711/103 |
| 2014/0156922 A1* | 6/2014 | Zitlaw | ................... | G06F 9/4403 711/103 |
| 2016/0170676 A1* | 6/2016 | Vogt | ........................ | G06F 3/0629 711/103 |
| 2016/0217847 A1* | 7/2016 | Ha | ........................ | G11C 7/1045 |
| 2017/0133078 A1* | 5/2017 | Hsieh | ................... | G11C 11/4076 |

OTHER PUBLICATIONS

First Office Action for U.S. Appl. No. 16/340,084, dated Mar. 13, 2020, 10 pages.

International Search Report and Written Opinion for PCT Patent Application No. PCT/US17/59102, dated Feb. 23, 2018, 10 pages.

Notice of Allowance for U.S. Appl. No. 16/340,084, dated Jul. 1, 2020, 8 pages.

Extended European Search Report for Patent Application No. 21177402.1, dated Sep. 23, 2021, 5 pages.

* cited by examiner

400

| | PARAMETER | SYMBOL | MIN/MAX | DELAY | UNIT |
|---|---|---|---|---|---|
| 412 | COMMAND PASS DISABLE DELAY | tCPDED | MIN | 4 | nCK |
| 414 | MINIMUM INTERVAL BETWEEN SRE AND SRX | tCSSR | MIN | MAX(7.5ns, 5nCK) | nS/nCK |
| 416 | VALID CLOCK REQUIREMENT AFTER SRE | tCKLCS | MIN | MAX(5ns, 5nCK) | nS/nCK |
| 418 | VALID CLOCK REQUIREMENT BEFORE SRX | tCKHCS | MIN | MAX(1.75ns, 3nCK) | nS/nCK |
| 420 | SR EXIT TO NEXT VALID COMMAND NOT REQUIRING DLL | tXS | MIN | TBD | nS |
| 422 | MINIMUM CS HIGH PULSE WIDTH | tCSH | MIN | 3 | nS |
| 424 | MAXIMUM TIME BEFORE CS GOES LOW AFTER SRE | tCSLSR | MAX | 5 | nS |

| | STATUS OF DRAM | DLL | PD EXIT | RELEVANT PARAMETERS |
|---|---|---|---|---|
| 612 | ACTIVE (ONE OR MORE BANKS OPEN) | ON | FAST | tXP TO ANY VALID COMMAND |
| 614 | PRECHARGED (ALL BANKS PRECHARGED) | ON | FAST | tXP TO ANY VALID COMMAND |

FIG. 6

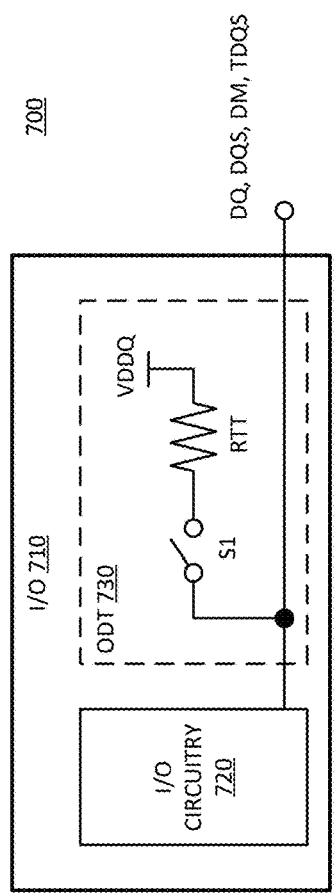

FIG. 7

| COMMAND | MODE REGISTER CONFIG SETTINGS | | | | RESULTS | |
|---|---|---|---|---|---|---|
| | RTT_PARK | RTT_WR | RTT_NOM_WR | RTT_NOM_RD | TARGET DRAM TERM | NON-TARGET DRAM TERM |
| ANY | ENABLED | DISABLED | DON'T CARE | DON'T CARE | HI-Z (ODT OFF) | HI-Z (ODT OFF) |
| ANY NON-TERM CMD | DISABLED | | | | RTT_PARK | RTT_PARK |
| | DISABLED | ENABLED | | | HI-Z (ODT OFF) | HI-Z (ODT OFF) |
| WR/MRW | DON'T CARE | DISABLED | ENABLED | | RTT_NOM_WR | RTT_NOM_WR |
| | | ENABLED | DISABLED | | RTT_WR | HI-Z (ODT OFF) |
| | ENABLED | DISABLED | DISABLED | | RTT_WR | RTT_NOM_WR |
| | ENABLED | ENABLED | DISABLED | | RTT_PARK | HI-Z (ODT OFF) |
| RD/MRR | DON'T CARE | DON'T CARE | DON'T CARE | DISABLED | RTT_PARK | HI-Z (ODT OFF) |
| | | | | ENABLED | HI-Z (ODT OFF) | RTT_NOM_RD |

| | NAME & DESCR | ABBR. | DEFINED FROM | DEFINE TO | DDR5 DEF | UNIT |
|---|---|---|---|---|---|---|
| 912 | ODT LATENCY ON FROM WRITE COMMAND TO RTT ENABLE | ODTLon_WR | REGISTERING EXTERNAL WRITE COMMAND | CHANGE RTT STRENGTH FROM PREVIOUS STATE TO RTT_WR | ODTLon_WL = WL -2 | nCK |
| 914 | ODT LATENCY ON FROM NT WRITE COMMAND TO RTT ENABLE | ODTLon_WR_NT | REGISTERING EXTERNAL WRITE COMMAND | CHANGE RTT STRENGTH FROM PREVIOUS STATE TO RTT_NOM_WR | ODTLon_WR_NT = ODTLon_WR | |
| 916 | ODT LATENCY OFF FROM WRITE COMMAND TO RTT DISABLE | ODTLoff_WR | REGISTERING EXTERNAL WRITE COMMAND | CHANGE RTT STRENGTH FROM RTT_WR TO RTT_PARK/ RTT_NOM_RD/ RTT_NOM_WR/HI-Z | ODTLoff_WL = TDB | nCK |
| 918 | ODT LATENCY OFF FROM NT WRITE COMMAND TO RTT DISABLE | ODTLoff_WR_NT | REGISTERING EXTERNAL WRITE COMMAND | CHANGE RTT STRENGTH FROM RTT_NOM_WR TO RTT_PARK/ RTT_NOM_RD/RTT_WR/ HI-Z | ODTLoff_WR_NT = ODTLoff_WR | |
| 920 | ODT LATENCY ON FROM READ COMMAND TO RTT ENABLE | ODTLon_RD | REGISTERING EXTERNAL READ COMMAND | CHANGE RTT STRENGTH FROM PREVIOUS STATE TO HI-Z | ODTLon_RD = TDB | nCK |
| 922 | ODT LATENCY ON FROM NT READ COMMAND TO RTT ENABLE | ODTLon_RD_NT | REGISTERING EXTERNAL READ COMMAND | CHANGE RTT STRENGTH FROM PREVIOUS STATE TO RTT_NOM_RD | ODTLon_RD_NT = ODTLon_RD | |
| 924 | ODT LATENCY OFF FROM READ COMMAND TO RTT DISABLE | ODTLoff_RD | REGISTERING EXTERNAL READ COMMAND | CHANGE RTT STRENGTH FROM HI-Z TO RTT_PARK/ RTT_NOM_RD/ RTT_NOM_WR/RTT_WR | ODTLoff_RD = TBD | nCK |
| 926 | ODT LATENCY OFF FROM NT READ COMMAND TO RTT DISABLE | ODTLoff_RD_NT | REGISTERING EXTERNAL READ COMMAND | CHANGE RTT STRENGTH FROM RTT_NOM_RD TO RTT_PARK/ RTT_NOM_WR/ RTT_WR/HI-Z | ODTLoff_RD_NT = ODTLoff_RD | |
| 928 | RTT CHANGE SKEW | tADC | TRANSITIONING FROM ONE RTT STATE TO NEXT RTT STATE | RTT VALID | tADC(min) = 150 tADC(max) = 950 | ps |

FIG. 9

| FUNCTION | ABBR | CS | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|---|
| ACTIVATE | ACT | L | L | L | R0 | R1 | R2 | R3 | BA0 | BA1 | BG0 | BG1 | BG2 | CID0 | CID1 | CID2 |
|  |  | H | R4 | R5 | R6 | R7 | R8 | R9 | R10 | R11 | R12 | R13 | R14 | R15 | R16 | CID3/R17 |
| RESERVED | RFU | L | H | L | L | L | L | V | V | V | V | V | V | V | V | V |
|  |  | H | V | V | V | V | V | V | V | V | V | V | V | V | V | V |
| RESERVED | RFU | L | H | L | L | L | H | V | V | V | V | V | V | V | V | V |
|  |  | H | V | V | V | V | V | V | V | V | V | V | V | V | V | V |
| WRITE PATTERN | WRP | L | H | L | L | H | L | V | BA0 | BA1 | BG0 | BG1 | BG2 | CID0 | CID1 | CID2 |
|  |  | H | V | C3 | C4 | C5 | V | C6 | C7 | C8 | C9 | C10 | AP=L | V | V | CID3 |
| MODE REGISTER WRITE | MRW | L | H | L | H | L | L | MRA0 | MRA1 | MRA2 | MRA3 | MRA4 | MRA5 | MRA6 | MRA7 | V |
|  |  | H | OP0 | OP1 | OP2 | OP3 | OP4 | OP5 | OP6 | OP7 | V | V | CW | V | V | V |
| MODE REGISTER READ | MRR | L | H | L | H | L | H | MRA0 | MRA1 | MRA2 | MRA3 | MRA4 | MRA5 | MRA6 | MRA7 | V |
|  |  | H | V | V | V | V | V | V | V | V | V | V | CW | V | V | V |
| WRITE | WR | L | H | L | H | H | L | V | BA0 | BA1 | BG0 | BG1 | BG2 | CID0 | CID1 | CID2 |
|  |  | H | V | C3 | C4 | C5 | BC8=L | C6 | C7 | C8 | C9 | C10 | AP=L | WR PARTIAL=L | V | CID3 |
| READ | RD | L | H | L | H | H | H | V | BA0 | BA1 | BG0 | BG1 | BG2 | CID0 | CID1 | CID2 |
|  |  | H | C2 | C3 | C4 | C5 | BC8=L | C6 | C7 | C8 | C9 | C10 | AP=L | V | V | CID3 |
| VREF CA CMD | VrefCA | L | H | H | L | L | L | OP0 | OP1 | OP2 | OP3 | OP4 | OP5 | OP6 | OP7 | V |
| REFRESH ALL | REF | L | H | H | L | L | H | CID3 | V | V | V | V | L | CID0 | CID1 | CID2 |
| REFRESH SAME BANK | REFsb | L | H | H | L | H | H | CID3 | BA0 | BA1 | V | V | H | CID0 | CID1 | CID2 |
| PRECHARGE ALL | PREA | L | H | H | H | L | L | CID3 | V | V | V | V | L | CID0 | CID1 | CID2 |
| PRECHARGE SAME BANK | PREsb | L | H | H | H | L | H | CID3 | BA0 | BA1 | V | V | H | CID0 | CID1 | CID2 |
| PRECHARGE | PRE | L | H | H | H | H | H | CID3 | BA0 | BA1 | BG0 | BG1 | BG2 | CID0 | CID1 | CID2 |
| RESERVED | RFU | L | H | H | H | L | L | V | V | V | V | V | V | V | V | V |
| SELF REFRESH ENTRY | SRE | L | H | H | H | L | H | V | V | V | V | V | L | V | V | V |
| POWER DOWN ENTRY | PDE | L | H | H | H | L | H | V | V | V | V | V | H | ODT=L | V | V |
| MULTIPURPOSE CMD | MPC | L | H | H | H | H | L | OP0 | OP1 | OP2 | OP3 | OP4 | OP5 | OP6 | OP7 | V |
| NO OPERATION | NOP | L | H | H | H | H | H | V | V | V | V | V | V | V | V | V |
| POWER DOWN EXIT | PDE | L | H | H | H | H | H | V | V | V | V | V | V | V | V | V |
| DESELECT | DES | H | X | X | X | X | X | X | X | X | X | X | X | X | X | X |

FIG. 10

APPLYING CHIP SELECT FOR MEMORY DEVICE IDENTIFICATION AND POWER MANAGEMENT CONTROL

PRIORITY

This application is a Continuation of U.S. application Ser. No. 16/340,084, filed Apr. 5, 2019, now U.S. Pat. No. 10,839,887, which is a U.S. National Phase application under 35 U.S.C. § 371 of International Application No. PCT/US2017/059102, filed Oct. 30, 2017, entitled "APPLYING CHIP SELECT FOR MEMORY DEVICE IDENTIFICATION AND POWER MANAGEMENT CONTROL", which in turn is based on U.S. Provisional Application No. 62/415,443, entitled, "APPLYING CHIP SELECT FOR MEMORY DEVICE IDENTIFICATION AND POWER MANAGEMENT CONTROL". The present application claims the benefit of priority of these applications.

FIELD

Descriptions are generally related to computer memory systems, and more particular descriptions are related to controlling refresh state and power management state via a chip select control signal.

BACKGROUND

The increased demand for memory resources causes a tension in memory subsystem design. From one perspective, the desire for increased bandwidth would seem best served by increasing the number of interconnection signal lines. However, size and power consumption constraints would suggest reducing the interconnection signal line count as much as possible. The desire for increased capacity might result in a similar tension. The removal of command signal lines threatens certain functionality, such as on-die termination, which has become standard in memory devices and which improves signal quality to provide improved bandwidth. However, default use of the functionality to an always-on state results in increased power use. Thus, the bandwidth and throughput performance remains in tension with the desire for lower power consumption.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4 is a representation of an embodiment of self-refresh timing parameters.

FIG. 6 is a representation of an embodiment of power down timing parameters.

FIG. 7 is a block diagram of an embodiment of ODT control for a memory device without a clock enable signal.

FIG. 8 is a representation of an embodiment of ODT termination states.

FIG. 9 is a representation of an embodiment of dynamic ODT timing parameters.

FIG. 10 is a representation of an embodiment of a command truth table.

Figure 1:
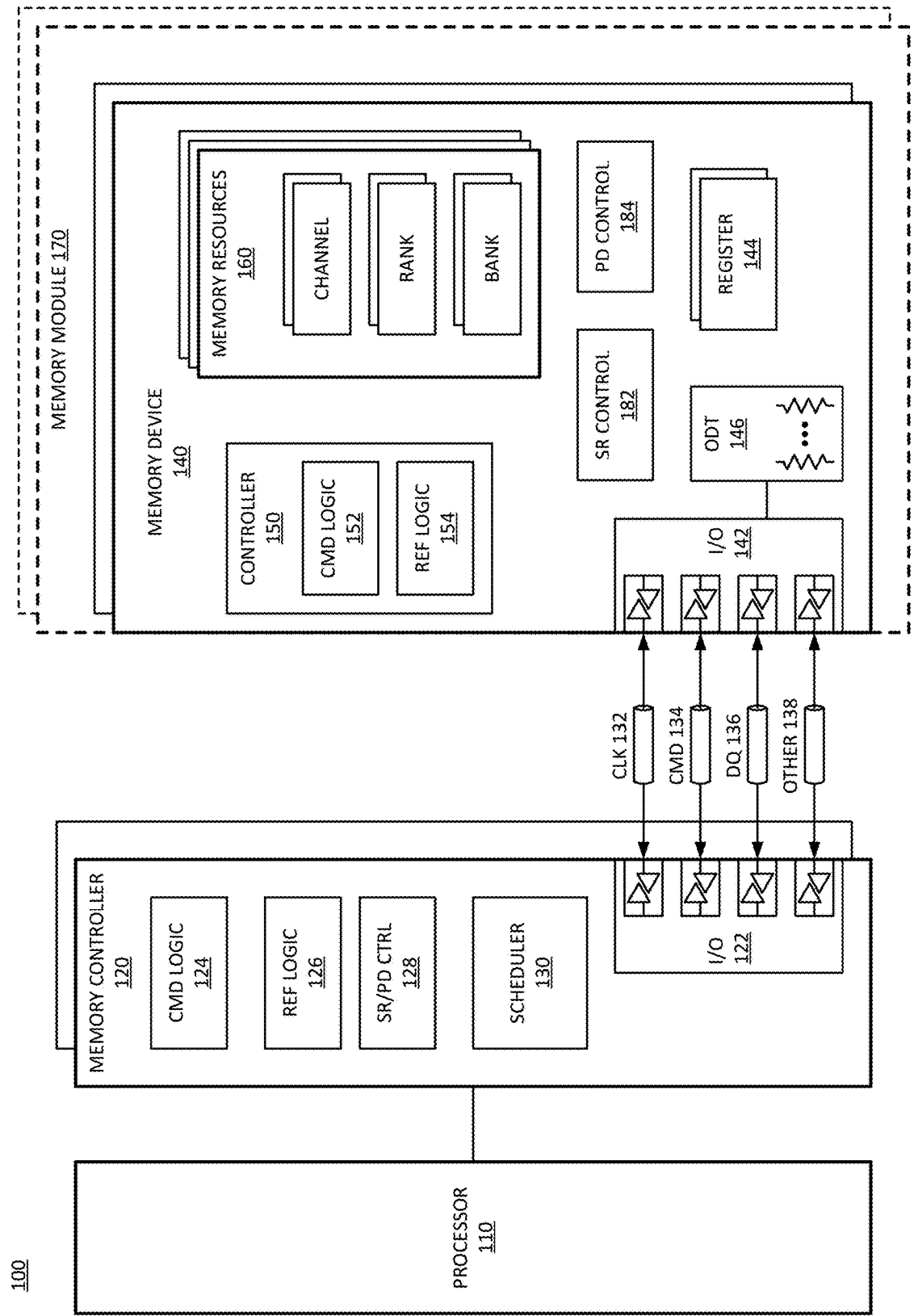
FIG. 1 is a block diagram of an embodiment of a memory subsystem in which combined control over chip select and power management state can be implemented.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, the tradeoff between performance and power consumption can be addressed through the removal of a dedicated signal lines, and the application of dual functionality of other signal lines. A memory subsystem triggers entry and exit of a memory device from low power mode with a chip select (CS) signal line. For a system where the command bus has no clock enable (CKE) signal line, the system can trigger low power modes with CS instead of CKE. The low power mode can include a powerdown (alternatively, power down or power-down) state. The low power mode can include a self-refresh state.

The memory device includes an interface to the command bus, and receives a CS signal combined with command encoding on the command bus to trigger a low power mode state change. The memory device can be configured to monitor the CS signal and selected other command signals while in low power mode. The system can send an on-die termination (ODT) trigger while the memory device is in low power mode, even without a dedicated ODT signal line. The low power operation can monitor selected signals to allow the functioning of ODT from low power states. As described herein, the same functionality as previous memory standards can be achieved with fewer signal pins.

Traditional memory devices used a clock enable (CKE) pin or CKE signal line for purposes of putting the memory device in self-refresh and in low-power modes (such as powerdown mode). The low power state can be triggered by a CS signal line can have dual functionality, functioning to select memory devices as well as to trigger a low power mode. The dual functionality of an existing signal line can provide an opportunity to remove the dedicated CKE pin. The elimination of a dedicated signal line for CKE can reduce the pin count and lower power consumption compared to previous memory implementations. The application of other states by command encoding can retain the functionality while providing savings in both power and logic.

In addition to a dedicated CKE control pin, traditional memory devices also use a dedicated ODT control pin. As with removal of the dedicated CKE signal line, elimination of a dedicated signal line for ODT can reduce the pin count and lower power consumption. As described herein, a system can provide additional modes for ODT that enable retention of the ODT functionality while providing savings in both power and logic. In one embodiment, a memory controller triggers a low power state of a memory device with command encoding, and without a dedicated CKE pin or signal. Controlling the entry and exit from self-refresh or powerdown or both with command encoding instead of a dedicated control signal or signal line of a command bus can free up space and logic. Freeing up space and logic can make room for newer features to be added to memory components.

In one embodiment, ODT and low power state transition functionality comparable to what is currently accomplished with dedicated pins can be incorporated onto the CS pin as follows. In one embodiment, the memory subsystem signals self-refresh by a memory controller sending a self-refresh entry command (SRE) accompanied by a CS transition. In one embodiment, the memory controller sends another CS transition with a self-refresh exit command (SRX). In one embodiment, the memory controller signals powerdown by sending a powerdown entry command (PDE) and then holding CS inactive until a powerdown exit command (PDX). The PDX can be signaled by taking CS active for one clock or more clocks while placing a NOP (no operation) command on the bus. It will be understood that the NOP command ensures the memory device does not attempt to execute any active command, but only comes out of powerdown. Alternatively to a NOP command, in one embodiment the memory controller issues a DES (deselect) command instead of a NOP command.

In one embodiment, the memory controller drives chip select signaling as follows, and the memory device monitors the chip select signal accordingly. In one embodiment, the memory system supports multicycle access commands, with the memory controller driving the command bus over multiple (e.g., two) consecutive transfer cycles to trigger a single command. In one embodiment, CS active on the first cycle only indicates a memory device that is the target of the command. In one embodiment, CS active for the first and second cycles indicates the memory device is not the target device (e.g., a non-target command). In one embodiment, a non-target memory command triggers a memory device to enable non-target termination (e.g., RTT_NOM). In one embodiment, CS not active for either the first or second cycles indicates the memory device does not see the command and remains in Park termination (e.g., RTT_Park).

FIG. 1 is a block diagram of an embodiment of a memory subsystem in which combined control over chip select and power management state can be implemented. System 100 includes a processor and elements of a memory subsystem in a computing device. Processor 110 represents a processing unit of a computing platform that may execute an operating system (OS) and applications, which can collectively be referred to as the host or the user of the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 100 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235, originally published by JEDEC in October 2013), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one embodiment, a system with volatile memory that needs to be refreshed can also include nonvolatile memory.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAM devices in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a memory bus, such as a memory channel as referred to above. I/O interface logic 122 (as well as I/O interface logic 142 of memory device 140) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices. The exchange of signals includes at least one of transmit or receive. While shown as coupling I/O 122 from memory controller 120 to I/O 142 of memory device 140, it will be understood that in an implementation of system 100 where groups of memory devices 140 are accessed in parallel, multiple memory devices can include I/O interfaces to the same interface of memory controller 120. In an implementation of system 100 including one or more memory modules 170, I/O 142 can include interface hardware of the memory module in addition to interface hardware on the memory device itself. Other memory controllers 120 will include separate interfaces to other memory devices 140.

The bus between memory controller 120 and memory devices 140 can be implemented as multiple signal lines coupling memory controller 120 to memory devices 140. The bus may typically include at least clock (CLK) 132, command/address (CMD) 134, and write data (DQ) and read data (DQ) 136, and zero or more other signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one embodiment, independent channels have different clock signals, C/A buses, data buses, and other signal lines. Thus, system 100 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 120 and memory devices 140. An example of a serial bus technology is 8B10B encoding and transmission of high-speed data with embedded clock over a single differential pair of signals in each direction. In one embodiment, CMD 134 represents signal lines shared in parallel with multiple memory devices. In one embodiment, multiple memory devices share encoding command signal lines of CMD 134, and each has a separate chip select (CS_n) signal line to select individual memory devices.

It will be understood that in the example of system 100, the bus between memory controller 120 and memory devices 140 includes a subsidiary command bus CMD 134 and a subsidiary bus to carry the write and read data, DQ 136. In one embodiment, the data bus can include bidirectional lines for read data and for write/command data. In another embodiment, the subsidiary bus DQ 136 can include unidirectional write signal lines for write and data from the host to memory, and can include unidirectional lines for read data from the memory to the host. In accordance with the chosen memory technology and system design, other signals 138 may accompany a bus or sub bus, such as strobe lines DQS. Based on design of system 100, or implementation if a design supports multiple implementations, the data bus can have more or less bandwidth per memory device 140. For example, the data bus can support memory devices that have either a ×32 interface, a ×16 interface, a ×8 interface, or other interface. The convention "xW," where W is an integer that refers to an interface size or width of the interface of memory device 140, which represents a number of signal lines to exchange data with memory controller 120. The interface size of the memory devices is a controlling factor on how many memory devices can be used concurrently per channel in system 100 or coupled in parallel to the same signal lines. In one embodiment, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one embodiment, memory devices 140 and memory controller 120 exchange data over the data bus in a burst, or a sequence of consecutive data transfers. The burst corresponds to a number of transfer cycles, which is related to a bus frequency. In one embodiment, the transfer cycle can be a whole clock cycle for transfers occurring on a same clock or strobe signal edge (e.g., on the rising edge). In one embodiment, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 140 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 140 represent memory resources for system 100. In one embodiment, each memory device 140 is a separate memory die. In one embodiment, each memory device 140 can interface with multiple (e.g., 2) channels per device or die. Each memory device 140 includes I/O interface logic 142, which has a bandwidth determined by the implementation of the device (e.g., ×16 or ×8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same command and data buses. In another embodiment, multiple memory devices 140 are connected in parallel to the same command bus, and are connected to different data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word. As non-limiting examples, a specific memory device can provide or receive, respectively, 8 bits of a 128-bit data word for a Read or Write transaction, or 8 bits or 16 bits (depending for a ×8 or a ×16 device) of a 256-bit data word. The remaining bits of the word will be provided or received by other memory devices in parallel.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 170. In one embodiment, memory modules 170 represent dual inline memory modules (DIMMs). In one embodiment, memory modules 170 represent other organization of multiple memory devices to share at least a portion of access or control circuitry, which can be a separate circuit, a separate device, or a separate board from the host system platform. Memory modules 170 can include multiple memory devices 140, and the memory modules can include support for multiple separate channels to the included memory devices disposed on them. In another embodiment, memory devices 140 may be incorporated into the same package as memory controller 120, such as by techniques such as multi-chip-module (MCM), package-on-package, through-silicon via (TSV), or other techniques or combinations. Similarly, in one embodiment, multiple memory devices 140 may be incorporated into memory modules 170, which themselves may be incorporated into the same package as memory controller 120. It will be appreciated that for these and other embodiments, memory controller 120 may be part of host processor 110.

Memory devices 140 each include memory resources 160. Memory resources 160 represent individual arrays of memory locations or storage locations for data. Typically memory resources 160 are managed as rows of data, accessed via wordline (rows) and bitline (individual bits within a row) control. Memory resources 160 can be organized as separate channels, ranks, and banks of memory. Channels may refer to independent control paths to storage locations within memory devices 140. Ranks may refer to common locations across multiple memory devices (e.g., same row addresses within different devices). Banks may refer to arrays of memory locations within a memory device 140. In one embodiment, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140 to operate in different "modes," where command information can trigger different operations within memory device 140 based on the mode. Additionally or in the alternative, different modes can also trigger different operation from address information or other signal lines depending on the mode. Settings of register 144 can indicate configuration for I/O settings (e.g., timing, termination or ODT (on-die termination) 146, driver configuration, or other I/O settings).

In one embodiment, memory device 140 includes ODT 146 as part of the interface hardware associated with I/O 142. ODT 146 can be configured as mentioned above, and provide settings for impedance to be applied to the interface to specified signal lines. In one embodiment, ODT 146 is applied to DQ signal lines. In one embodiment, ODT 146 is applied to command signal lines. In one embodiment, ODT 146 is applied to address signal lines. In one embodiment, ODT 146 can be applied to any combination of the preceding. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading. ODT 146 can be applied to specific signal lines of I/O interface 142, 122, and is not necessarily applied to all signal lines.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller, and is separate from memory controller 120 of the host. Controller 150 can determine what mode is selected based on register 144, and configure the internal execution of operations for access to memory resources 160 or other operations based on the selected mode. Controller 150 generates control signals to control the routing of bits within memory device 140 to provide a proper interface for the selected mode and direct a command to the proper memory locations or addresses. Controller 150 includes command logic 152, which can decode command encoding received on command and address signal lines. Thus, command logic 152 can be or include a command decoder. With command logic 152, memory device can identify commands and generate internal operations to execute requested commands.

Referring again to memory controller 120, memory controller 120 includes command (CMD) logic 124, which represents logic or circuitry to generate commands to send to memory devices 140. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 140, memory controller 120 can issue commands via I/O 122 to cause memory device 140 to execute the commands. In one embodiment, controller 150 of memory device 140 receives and decodes command and address information received via I/O 142 from memory controller 120. Based on the received command and address information, controller 150 can control the timing of operations of the logic and circuitry within memory device 140 to execute the commands. Controller 150 is responsible for compliance with standards or specifications within memory device 140, such as timing and signaling requirements. Memory controller 120 can implement compliance with standards or specifications by access scheduling and control.

Memory controller 120 includes scheduler 130, which represents logic or circuitry to generate and order transactions to send to memory device 140. From one perspective, the primary function of memory controller 120 could be said to schedule memory access and other transactions to memory device 140. Such scheduling can include generating the transactions themselves to implement the requests for data by processor 110 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 120 typically includes logic such as scheduler 130 to allow selection and ordering of transactions to improve performance of system 100. Thus, memory controller 120 can select which of the outstanding transactions should be sent to memory device 140 in which order, which is typically achieved with logic much more complex than a simple first-in first-out algorithm. Memory controller 120 manages the transmission of the transactions to memory device 140, and manages the timing associated with the transaction. In one embodiment, transactions have deterministic timing, which can be managed by memory controller 120 and used in determining how to schedule the transactions with scheduler 130.

In one embodiment, memory controller 120 includes refresh (REF) logic 126. Refresh logic 126 can be used for memory resources that are volatile and need to be refreshed to retain a deterministic state. In one embodiment, refresh logic 126 indicates a location for refresh, and a type of refresh to perform. Refresh logic 126 can trigger self-refresh within memory device 140, or execute external refreshes which can be referred to as auto refresh commands) by sending refresh commands, or a combination. In one embodiment, system 100 supports all bank refreshes as well as per bank refreshes. All bank refreshes cause the refreshing of banks within all memory devices 140 coupled in parallel. Per bank refreshes cause the refreshing of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

In an embodiment, memory controller 120 includes self-refresh and powerdown (SR/PD) control 128. SR/PD control 128 represents logic at the host that can provide command encoding to control the entry and exit of self-refresh and powerdown without a CKE pin. For example, the entry and exit can be controlled by command encoding and use of a CS pin. Thus, memory controller 120 can provide the proper command encoding and signaling to trigger SR and PD in memory devices 140. In one embodiment, SR/PD control 128 enables memory controller 120 to provide ODT functionality when one or more memory devices 140 are in a low power state (either SR or PD). The encoding and enabling of the functionality can be in accordance with any embodiment described herein. In one embodiment, SR control and PD control are separate features within memory controller 120.

In an embodiment, memory devices 140 include self-refresh (SR) control 182 and powerdown (PD) control 184. SR control 182 and PD control 184 represent logic at the memory devices as a counterpart to SR/PD control 128 of the host. In one embodiment, SR control 182 and PD control 184 are part of the same logic. In one embodiment, SR control 182 or PD control 184 or both are part of controller 150, such as command logic 152.

SR control 182 and PD control 184 can read command encoding to control the entry and exit of self-refresh and power down without a CKE pin, respectively. For example, the entry and exit can be controlled by command encoding and use of a CS pin or CS connector (e.g., a pin, ball, tab, or other connector). Thus, memory controller 120 can provide the proper command encoding and signaling to trigger SR or PD in memory devices 140, and memory devices 140 can enter and exit low power states in response to command encoding instead of the use of dedicated pins.

In one embodiment, memory devices 140 provide ODT functionality when in a low power state (either SR or PD), by monitoring selected signal lines that remain active in the low power state. The ODT signal line monitoring will consume some power, which can be offset or justified by the lack of power use from a dedicated CKE signal line. In one embodiment, SR control 182 or PD control 184 or both enable the providing of ODT functionality by monitoring for a termination state. The encoding and enabling of the functionality can be in accordance with any embodiment described herein.

In one embodiment, CS is considered part of command bus CMD 134. In one embodiment, CS can be considered separate from the other command signals, as part of other signals 138. In either case, the CS signal provides control functions. In one embodiment, the CS signal line and command encoding enables command based self-refresh or powerdown functions instead of having a specific power state signal such as CKE. Such a command based approach enables the removal of CKE pin, while still being able to achieve the same functionality using existing pins by switching from pin based to command based triggers, which saves pin space and circuitry on memory device 140. The circuitry can include signal routing and operational logic.

The CS pin refers to a connector provided for external chip select signaling in a device "pinout". Traditionally CS has a function of identifying a memory device for a command operation. Utilization of the CS pin to perform or control SR or PD or both can eliminate the need for a dedicated CKE pin. Elimination of a dedicated connector can provide logic and power savings, which can be increased with multimode receiver optimizations during the low power state.

In one embodiment, memory controller 120 triggers entry into the low power by asserting the CS signal. In one embodiment, memory controller 120 drives a logic high on the CS signal line to assert CS. In one embodiment, memory controller 120 drives a logic low on the CS signal line to assert CS (e.g., for an inverted signal). Memory controller 120 can provide proper encoding on the command signal lines at the rising edge of the clock in conjunction with asserting the CS signal.

In one embodiment, during self-refresh, memory device 140 switches from its standard receiver to a CMOS (complementary metal-oxide-semiconductor) based receiver. In one embodiment, in addition to switching to a CMOS receiver, memory device 140 drops termination of the CS signal line to save power. In one embodiment, memory device 140 exits from SR in response to a sequence of events including seeing the CS transition from low to high.

In one embodiment, during powerdown, memory device 140 deactivates its input and output buffers, excluding one or more signal lines that can be monitored for functionality in powerdown. For example, memory device 140 can monitor CK_t and CK_c (the complementary clock signals) and RESET_n while in powerdown. In one embodiment, memory device 140 can monitor the CS signal line for a CS trigger to exit from PD.

In one embodiment, Read commands and MRR (mode register read) commands use the same termination and do not need to be differentiated by memory device 140 while in powerdown. Similarly, in one embodiment, Write commands and MRW (mode register write) commands use the same termination and do not need to be differentiated by memory device 140 while in powerdown.

In one embodiment, the MRW commands only require termination when in per DRAM addressability (PDA) mode. The logic for MRW command termination can be simplified by implementing a rule that prevents use of PDA mode when any rank is in powerdown mode. Even with such a rule, PDA can be enabled with relatively simply. For example, when not in PDA mode, memory controller 120 may not assert the CS to the non-target DRAMs. In one embodiment, when in PDA mode memory controller 120 can assert the CS to the non-target DRAMs for the first and second cycles of a multicycle command. Such a command encoding can provide the exact same signaling used when not in powerdown mode.

For previous DRAM devices, such as DDR4 DRAMs, CKE and ODT functions are controlled by separate pins. This allows for putting the DRAM devices into powerdown mode by taking CKE low and holding it low. During this time, the command/address bus and chip select signals are disabled, but the ODT pin is not disabled. This allows the ODT pin to be controlled by the host controller to actively switch between PARK termination (if enabled) and Nominal Termination, based on activity to other DRAM ranks that are not in powerdown mode.

The removal of a dedicated CKE pin and the removal of a dedicated ODT pin could result in the loss of certain ODT functionality. In one embodiment, a DDR DRAM, such as a DDR5 DRAM, can perform an ODT function on the data bus while in a powerdown state. With elimination of separate CKE and ODT pins, command encoding with CS signaling as described herein can provide functionality previously provided by CKE and ODT pins. Simply removing the pins and providing a command encoding could result in no capability in powerdown to signal a specific device to enable its termination when in the powerdown mode. Previous DDR standards enabled the application of termination while in powerdown because although the command signal lines for command encoding were not enabled, the dedicated pins could be used to signal termination states.

In one embodiment, termination on DQ bus 136 is improved with information about the burst length, to know how long to apply the termination. In one embodiment, the burst length (BL) can either be fixed to 8 or 16 via MR bits of register 144, in which case memory device 140 does not need burst length information with the command because it can be read the information from register 144. In one embodiment, the burst length can be set to "Burst on the Fly" (e.g., by a mode register setting), in which case memory controller 120 sets the burst length on a command-by-command basis. The best termination would be provided when the terminating memory device(s) 140 knows the burst length as set by a BL bit in the command encoding. In one embodiment, the BL bit can be provided on the same selected CA signal lines used to detect read and write commands. For example, the read or write can be indicated on a first cycle of the command, and the BL can be indicated on one of the bits in the second cycle (e.g., on the second cycle of command bit CA4 for commands requiring termination). In such an implementation, there are three bits of information for memory device 140 to provide termination, and all three bits can be carried on two signal lines over two cycles of the command. Thus, in one embodiment, the information needed for ODT operation in powerdown can be provided with only two CA bits needing to remain active. Other implementations can maintain more bits active, but will consume more power in PD mode.

While the ODT functionality has been described primarily with respect to powerdown modes, in one embodiment, the functionality can be extended to self-refresh mode. Self-refresh generally does not require ODT functionality, and may use a slightly different command signaling to indicate self-refresh exit that precludes the ability to signal ODT functionality. Self-refresh is sensitive to power and would likely not want to compromise any power difference for ODT functionality. However, ODT functionality can be indicated to a device in self-refresh in similar manner as for powerdown by enabling the memory device to monitor one or more signal lines, and could follow the same pattern in self-refresh as described above with respect to powerdown.

In one embodiment, a protocol allows a DRAM (e.g., a DDR5 DRAM) device to be in powerdown mode and still be able to adjust its termination on the fly when other ranks, which are not in powerdown, are being accessed. In one embodiment, a DRAM in powerdown maintains selected CA bits active by monitoring selected CA bus signal lines of CA bus 134 in powerdown. Memory device 140 can monitor CS as well as these bits to adjust the ODT termination.

In one embodiment, the elimination of the CKE and ODT pins applies to a DDR5 DRAM implementation. In one embodiment, DDR5 DRAMs remove a dedicated pin (e.g., CKE) which traditionally supports SR and PD features of the DDR memory. Instead of triggering SR and PD modes based on dedicated pins, as described herein, SR entry (SRE), SR exit (SRX), PD entry (PDE), and PD exit (PDX) can be command based modes triggered by the CS signal. In one embodiment, memory device 140 normally applies termination to the CS pin, but drops termination on the CS pin and enters an extremely low power mode during self-refresh.

In one embodiment, memory device 140 includes a multimode receiver, and switches from a standard receiver to a CMOS (complementary metal oxide semiconductor) based receiver. Such a CMOS receiver is different than either a p-type (doped with material to result in mobile hole charge carriers) or n-type (doped with material to result in mobile electron charge carriers). Such receivers tend to be preferred for lower power modes due to reduced swing. Compared to a standard driver, a CMOS based receiver can have a voltage swing that is rail to rail on voltage levels, rather than a low power signaling technique where command signals do not utilize the full voltage range of the voltage levels feeding the transceiver circuitry. Thus, the device can operate with a low swing receiver in normal mode, and switch to a full-swing receiver in low power mode. The use of a full-swing receiver can provide a better signal trigger to wake or cause operations in the device in low power mode (e.g., either in self-refresh or powerdown).

In one embodiment, I/O 122 of memory controller 120 drives the CS signal line low until sending a command to trigger memory device 140 to exit from the low power mode. In one embodiment of system 100 where multiple memory devices 140 are associated with a single memory controller 120, the memory controller drives command signals multiple memory devices in parallel. Some of the memory devices can be in a low power mode while others are active. In one embodiment, memory controller 120 sends commands to the memory devices in parallel, and the devices in low power mode monitor only selected signal lines of command bus 134, to send signals to trigger an operation (such as data bus termination) by a device in low power mode. As such, the memory controller 120 can send signals for the devices in low power with the selected signal lines monitored by the memory devices. In one embodiment, memory controller 120 sends an ODT trigger to memory device 140 via the CS signal line and selected signal lines of command bus 134.

As described, the CS pin or CS signal line can be considered to have multiple modes. The CS pin can operate as a traditional CS pin as one mode of operation, which provides an identification function by selecting which device or devices are to execute a command. The CS pin can operate as a CKE proxy as another mode of operation, to perform identification for devices not in low power mode and to provide a power management control for devices going into and out of lower power states. The CS pin can thus trigger a low power state, and then be simply an identification signal upon exit from low power. In one embodiment, the CS pin can perform identification and power management control for devices in low power states, such as to trigger ODT and to trigger exit from the low power mode. The mode can be controlled by command encoding instead of a single pin control. Command encoding refers to a combination of signals on CMD bus 134 to indicate a state or operation. Thus, instead of a single pin toggling to cause an operation or a function (which can be referred to as pin control or signal control), a signal on one pin must be accompanied by encoding on one or more additional signal lines to cause the operation or function (which can be referred to as command encoding or command control).

Figure 2:
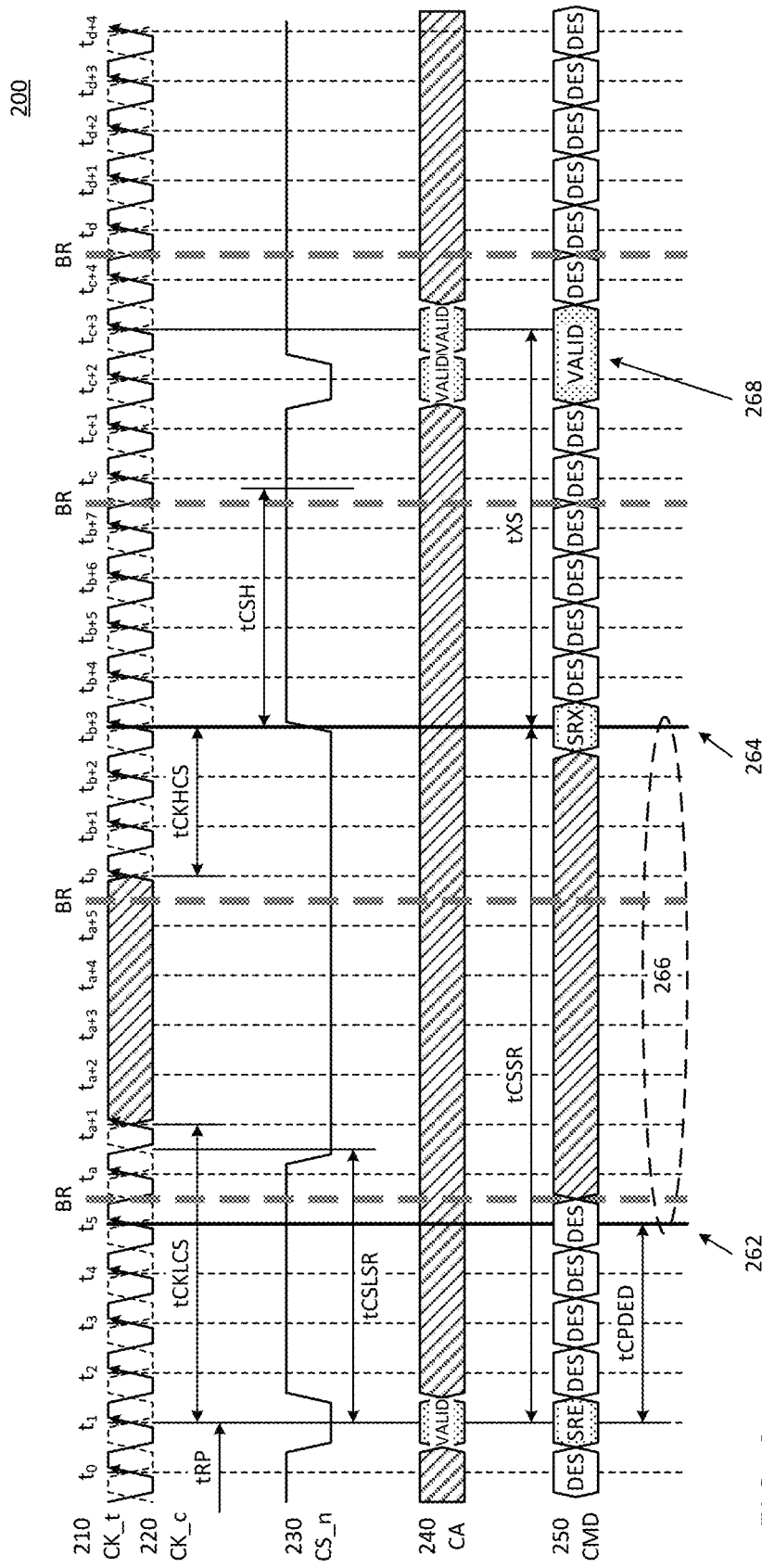
FIG. 2 is a timing diagram of an embodiment of self-refresh entry and exit without a clock enable signal.

FIG. 2 is a timing diagram of an embodiment of self-refresh entry and exit without a clock enable signal. Diagram 200 represents one embodiment of signaling or command encoding that can represent self-refresh operation control. In one embodiment, a self-refresh command can be used to retain data in a DDR SDRAM, even if the rest of the system is powered down. When in the SR mode, the DRAM or memory device retains data without external clocking. The DRAM device has a built-in timer to accommodate SR operation.

Diagram 200 illustrates various signals triggered by one or more signal lines of an interface between a memory controller and one or more memory devices, such as memory controller 120 and memory devices 140 of system 100. CK_t 210 represents a clock signal on a clock signal line, and CK_c 220 represents a complementary clock signal. The memory controller drives the clock signal as an external signal to the memory device. The complementary clock signal can be provided by the memory controller on another signal line or can be derived internally within the DRAM from the clock signal. It will be understood that the signal lines illustrated will be driven and received by I/O circuitry in the memory controller and DRAM devices.

In one embodiment, diagram 200 applies to a DRAM that does not have a CKE pin or which does not use a CKE signal line to control entry and exit of low power states. In one embodiment, a memory controller triggers self-refresh entry (SRE) 262 and exit (SRX) 264 by command-based signaling instead of a dedicated pin. The DRAM remains in self-refresh during 266, from 262 to 264. Signal 230 represents a CS signal line. As illustrated, signal line 230 is labeled as CS_n, referring to having a separate signal line to each of multiple associated DRAMs. The separate CS signal line is a separate signal line to the memory controller, to allow the controller to individually select DRAMs. In a multi-DRAM package or device, the package can have multiple CS signal lines to select individual devices, or if a device has banks on different channels.

CA signal line 240 represents the command and address signal line between a memory controller and the specific DRAM. The signal line represents the period between valid commands sent from the memory controller. The command signal line CMD 250 represents the decoded command as received at the DRAM. Command-based signaling refers to the application of command encoding on the C/A signal lines of CA 240. As with other command encoding to trigger the execution of a command by a DRAM, the memory controller can trigger selected one or more DRAMs to execute the command based on the setting of CS_n signal 230. As illustrated in diagram 200, CMD 250 SRE command (at time t1) is defined by having CS_n LOW and the proper encoding at the rising edge of the clock. In one embodiment, the SRX command (at time t(b+3)) is defined by the transition of CS_n LOW to HIGH with a defined pulse width.

In one embodiment, there is a delay period of tCKLCS after SRE is registered or after the SRE command for the system to change the external clock frequency or halt the external clock, as illustrated at time t(a+1). It will be understood that the system must restart the clock and stabilize the signal a period of time tCKHCS before the device can exit SR operation, as shown between time tb and the SRX command. The period is illustrated to be three clock cycles, which can be more or less in different implementations. The clock is internally disabled during SR operation to save power. In one embodiment, the minimum time the DRAM remains in SR mode is tCSSR (from SRE to SRX), with the period 266 representing the time when the DRAM enters SR after SRE, until the SRX command.

In one embodiment, before issuing the SRE command, the DRAM must be idle with all banks in precharge state with a time period tRP satisfied. "Idle state" can be defined as all banks being closed with time periods of tRP, tDAL (not illustrated in diagram 200), or others satisfied, where no data bursts are in progress, and all timings from previous operations are satisfied (e.g., tMRD, tMRRI, tRFC, tZQ, or others, none of which are illustrated in diagram 200). In one embodiment, a deselect command must be registered on last positive clock edge before issuing the SRE command. In one embodiment, once the SRE command is registered, the memory controller continues to register deselect commands at the next positive clock edges until a period of tCPDED is satisfied, which represents a delay between registering the SRE command and the DRAM entering self-refresh. Diagram 200 illustrates a tCPDED of four clock cycles, which can be more or fewer clock cycles in other implementations. In one embodiment, after tCPDED has been satisfied but before tCSLSR expires, the memory controller must transition CS_n, such as high to low as illustrated. In one embodiment, after tCSLSR, the CS_n will transition low and stay low until SRX. In one embodiment, the DRAM may switch to a CMOS based receiver to save more power. The DRAM device can transition to a CMOS receiver at a time that coincides with CS_n transitioning.

In one embodiment, when the DRAM has entered SR mode, all of the external control signals, except CS_n and RESET_n, are "Don't Care" with respect to the specific DRAM. In one embodiment, for proper SR operation, all power supply and reference pins (e.g., VDD, VDDQ, VSS, VSSQ, and VPP) must be at valid levels. DRAM internal VrefDQ or VrefCA generator circuitry may remain ON or turned OFF depending on DRAM design. If DRAM internal VrefDQ or VrefCA circuitry is turned OFF in SR, when the DRAM exits from the SR state, it ensures that VrefDQ or VrefCA and generator circuitry is powered up and stable within a period tXS.

In one embodiment, the first write operation or first write leveling activity may not occur earlier than tXS after exit from SR. In one embodiment, the DRAM initiates a minimum of one refresh command internally within a period of tSR (not illustrated in diagram 200) once it enters SR mode. Self-refresh refers to refresh controlled by the DRAM, where the DRAM generates internal refresh operations or internal refresh commands to cause refresh of the memory locations. Self-refresh is contrasted from auto-refresh or external refresh that is controlled by a specific command from the memory controller.

In one embodiment, the DRAM automatically disables ODT termination and sets Hi-Z as termination state regardless of RTT configuration when it enters SR mode. In one embodiment, upon exiting SR, the DRAM automatically enables ODT termination and sets RTT_PARK asynchronously during tXSDLL (not illustrated in diagram 200) when RTT_PARK is enabled. The period tXS refers to a period of time between the SRX command and the first valid command that can be issued to the DRAM. The period tXSDLL refers to a time between the SRX command and the first valid command that requires DLL. During normal operation (DLL on) the DLL is automatically disabled upon entering SR and is automatically enabled (including a DLL-Reset) upon exiting SR.

In one embodiment, the procedure for exiting SR follows a sequence of events. In one embodiment, the following sequence is required for exit from SR. First, the system allows time for the clock to become stable prior to the CS_n high. When the DRAM switches to a CMOS based driver to save power, the DRAM will trigger SRX upon seeing the CS_n transition from low to high. In one embodiment, the DRAM will exit SR only if CS_n 230 transitions high and remains high for at least a period of tCSH. The exit timing from self-refresh exit to first valid command not requiring a locked DLL is tXS. In one embodiment, the value of tXS is (tRFC+10 ns). The delay of tXS allows for any refreshes started by the DRAM to complete. As tRFC continues to grow with higher density devices, tXS will grow as well.

In one embodiment, once an SRX command (e.g., a combination of CS_n going high for at least tCSH and a DES command encoding on the command bus) is registered, the following timing delay is satisfied. The timing can define when the DRAM can receive a first valid command at 268. The system satisfies the time period tXS for commands that do not require a locked DLL, such as ACT, PRE, REF, SRE, PDE, WR, or WRP. The system satisfies the time period tXSFast (not illustrated in diagram 200) for commands that do not require a locked DLL and that exit the refresh early, such as aborting the refresh operation, such as ZQStart, ZQLatch, MRR, or MRW. The system satisfies the time period tXSDLL for commands that require a locked DLL, such as RD.

Depending on the system environment and the amount of time spent in the SR state, ZQ calibration commands may be required to compensate for the voltage and temperature drift defined for "ZQ Calibration Commands". The memory controller and DRAM should satisfy applicable timing requirements associated with issuing ZQ calibration commands.

The use of Self-Refresh mode introduces the possibility that an internally timed refresh event can be missed when CS_n is pulsed for exit from SR mode. In one embodiment, upon exit from SR, the DRAM requires a minimum of one extra external refresh command before it is put back into SR mode.

Figure 3:
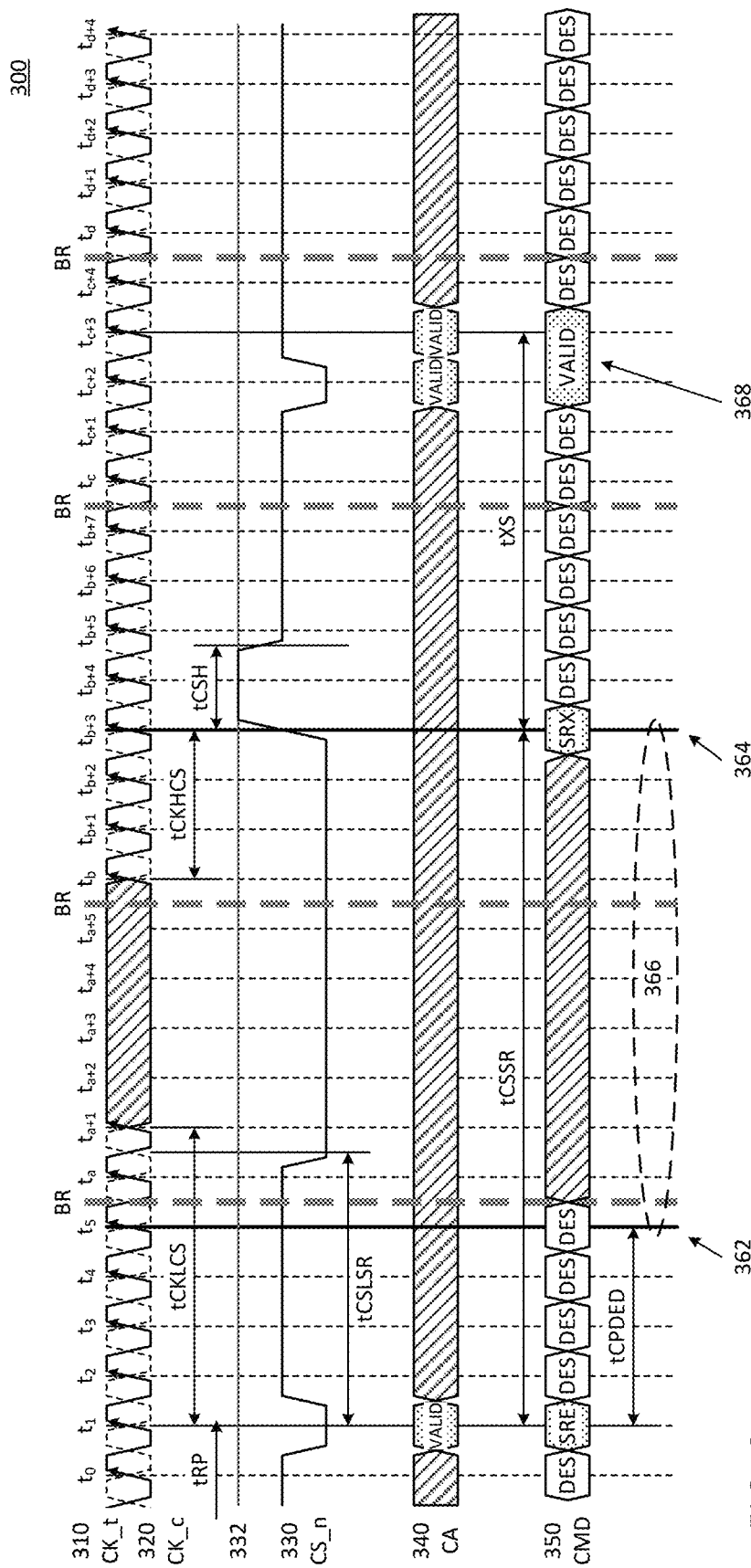
FIG. 3 is a timing diagram of an embodiment of self-refresh entry and exit without a clock enable signal with an expanded chip select signal swing.

FIG. 3 is a timing diagram of an embodiment of self-refresh entry and exit without a clock enable signal with an expanded chip select signal swing. Diagram 300 can be the same as diagram 200, except that CS_n signal line 330 illustrates a higher swing to trigger SRX than the comparable signal in diagram 200. In one embodiment, the pulse to trigger SRX in diagram 300 is also shorter in length than the comparable pulse in diagram 200. In one embodiment, the pulse is the same or nearly the same as the length of the pulse in diagram 200 despite the higher signal level.

The discussion above with respect to diagram 200 applies as well to diagram 300. CK_t 310 represents a clock signal on a clock signal line, and CK_c 320 represents a complementary clock signal. Signal 330 represents a CS signal line. CA signal line 340 represents the command and address signal line between a memory controller and the specific DRAM. The command signal line CMD 350 represents the decoded command as received at the DRAM. Diagram 300 can apply to a DRAM that does not have a CKE pin or which does not use a CKE signal line to control entry and exit of low power states. In one embodiment, a memory controller triggers self-refresh entry (SRE) 362 and exit (SRX) 364 by command-based signaling instead of a dedicated pin. The DRAM remains in self-refresh during 366, from 362 to 364. The first valid command the DRAM can receive is at 368. In one embodiment, the SRE and SRX commands are defined by the state or transition of CS 330 with proper command encoding for CMD 350 at the rising edge of the clock as defined in a command truth table for the DRAM.

Diagram 300 illustrates a different exit from SR than diagram 200. In one embodiment, the DRAM exits SR at 364 with the SRX command and a transition on CS 330 to a high logic value. Diagram 300 illustrates an additional high logic level for signal line 330. Namely, level 332 can represent a VDD H CMOS level, which is a higher voltage swing than a standard I/O interface. In one embodiment, CS 330 transitions to voltage level 332 for at least a period of tCSH before transitioning to a standard high logic level. In one embodiment, the lowering from level 332 to the standard high logic level coincides with the transition of the DRAM from a CMOS receiver to a standard receiver. In one embodiment, tCSH extends from the SRX command to the first valid command. In one embodiment, tCSH ends prior to the first valid command, and there is a period of time between the transition from the high logic level 332 and the first valid command.

FIG. 4 is a representation of an embodiment of self-refresh timing parameters. Table 400 illustrates various SR timing parameters, in accordance with an embodiment described herein where power management is command controlled instead of signal controlled.

Row 412 illustrates a command pass disable delay parameter, having a symbol of tCPDED. In one embodiment, the parameter has a minimum delay of 4 clock cycles (nCK). Row 414 illustrates a parameter tCSSR, which is a minimum interval between SRE and SRX. In one embodiment, the parameter has a minimum delay of the maximum or the greater of 7.5 nanoseconds (ns) or 5 clock cycles.

Row 416 illustrates a parameter tCKLCS, which defines a valid clock requirement after SRE. In one embodiment, the parameter has a minimum delay of the maximum or the greater of 5 ns or 5 clock cycles. Row 418 illustrates a parameter tCKHCS, which defines a valid clock requirement before SRX. In one embodiment, the parameter has a minimum delay of the maximum or the greater of 1.75 ns or 3 clock cycles.

Row 420 illustrates a parameter tXS, which defines a delay between SRX and the next valid command not requiring DLL. Row 422 illustrates a parameter tCSH, which defines a minimum CS high pulse width for SRX. In one embodiment, the parameter has a minimum delay of 3 ns. Row 424 illustrates a parameter tCSLSR, which defines a maximum time before CS goes low after SRE. In one embodiment, the parameter has a maximum delay of 5 ns.

Figure 5:
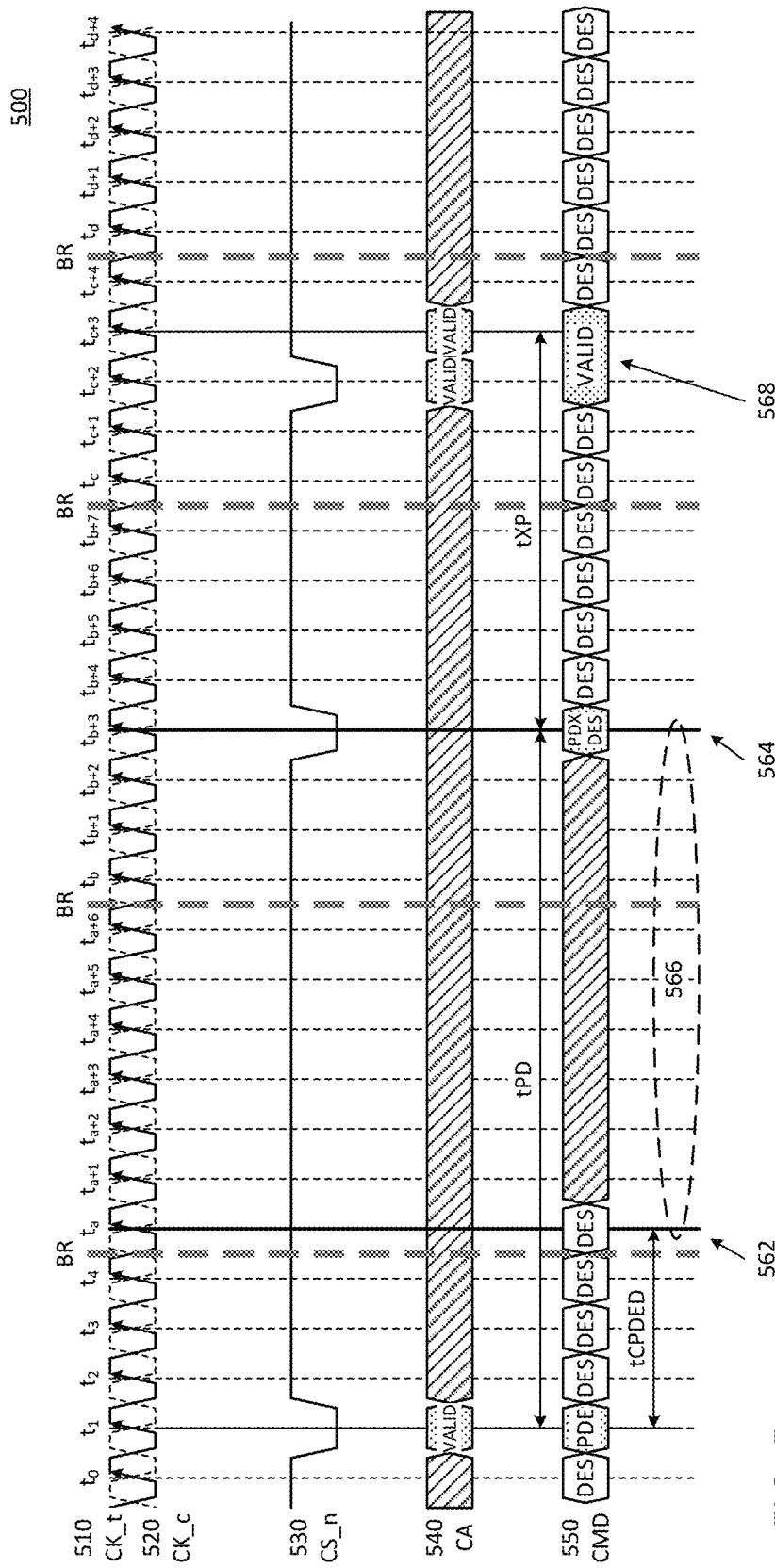
FIG. 5 is a timing diagram of an embodiment of power down entry and exit without a clock enable signal.

FIG. 5 is a timing diagram of an embodiment of power down entry and exit without a clock enable signal. Diagram 500 represents one embodiment of signaling or command encoding that can represent powerdown operation control. In one embodiment, a powerdown command can be used to place a DDR SDRAM in a power saving state.

Diagram 500 illustrates one embodiment of signaling for powerdown entry and exit. In one embodiment, the PDE and PDX control are command based, triggered by the CS_n and command encoding, instead of a dedicated pin control (e.g., CKE). In one embodiment, once in PD mode, the CS_n acts effectively like the historic CS_n pin, waiting for it to transition from HIGH to LOW (with its command). CK_t 510 represents a clock signal on a clock signal line, and CK_c 520 represents a complementary clock signal. Signal 530 represents a CS signal line. CA signal line 540 represents the command and address signal line between a memory controller and the specific DRAM. The command signal line CMD 550 represents the decoded command as received at the DRAM.

Diagram 500 can apply to a DRAM that does not have a CKE pin or which does not use a CKE signal line to control entry and exit of low power states. In one embodiment, a memory controller triggers powerdown entry (PDE) 562 and exit (PDX) 564 by command-based signaling instead of a dedicated pin. The DRAM remains in PD during 566, from 562 to 564. The first valid command the DRAM can receive is at 568. In one embodiment, the PDE and PDX commands are defined by the state or transition of CS 530 with proper command encoding for CMD 550 at the rising edge of the clock as defined in a command truth table for the DRAM. In one embodiment, in PDE mode the DRAM samples CS signal 530 on every edge.

For diagram 500, a memory controller interfaces with one or more memory devices, such as memory controller 120 and memory devices 140 of system 100. The memory controller drives the clock signal as an external signal to the memory device. The complementary clock signal can be provided by the memory controller on another signal line or can be derived internally within the DRAM from the clock signal. It will be understood that the signal lines illustrated will be driven and received by I/O circuitry in the memory controller and DRAM devices.

As illustrated, signal line 530 is labeled as CS_n, referring to having a separate signal line to each of multiple associated DRAMs. The separate CS signal line is a separate signal line to the memory controller, to allow the controller to individually select DRAMs. In a multi-DRAM package or device, the package can have multiple CS signal lines to select individual devices, or if a device has banks on different channels.

As with other command encoding to trigger the execution of a command by a DRAM, the memory controller can trigger selected one or more DRAMs to execute a command of CA 540 based on the setting of CS_n signal 530. As illustrated in diagram 500, CMD 550 PDE command (at time t1) is defined by having CS_n LOW and the proper encoding at the rising edge of the clock. In one embodiment, the PDX command (at time t(b+3)) is defined by the a CS_n pulse with proper command encoding.

In one embodiment, the DRAM enters PD when the PDE command is registered. In one embodiment, unlike self-refresh mode, the memory controller only pulses CS_n to trigger entry into powerdown, and does not hold the signal constantly low while in PD. In one embodiment, the DLL should be in a locked state when the DRAM enters power-down, to enable fastest PD exit timing. In one embodiment, during powerdown, if all banks are closed after any in-progress commands are completed, the DRAM will be in precharge PD mode, and if any bank is open after in-progress commands are completed, the DRAM will be in active PD mode. In one embodiment, DRAM design provides all AC and DC timing and voltage specification as well as proper DLL operation as long as the DRAM controller complies with DRAM specifications.

In one embodiment, in PD mode, the memory controller maintains RESET_n high, and a stable clock signal at the inputs of the DRAM, and all other input signals are "Don't Care". In one embodiment, the memory controller is required to maintain RESET_n high. In one embodiment, if RESET_n goes low during PD, the DRAM will exit PD mode and enters into reset state. In one embodiment, power-down duration is limited by nine times tREFI of the device.

CS can be used to trigger the PD exit. In one embodiment, the first valid command can occur tXP after exit from PD.

In one embodiment, once the PDE command is registered, the memory controller continues to register deselect commands at the next positive clock edges until a period of tCPDED is satisfied, which represents a delay between registering the PDE command and the DRAM entering powerdown. The period between the PDE command and the PDX command is a period of tPD. In one embodiment, the PDX command is a deselect command with the CS asserted. In one embodiment, the DRAM does not recognize other commands while in PD.

In one embodiment, entering power-down deactivates the input and output buffers, excluding selected signals (e.g., CK_t, CK_c, CS_n, RESET_n). In one embodiment, if CA11=L during the PDE command, the DRAM will continue to monitor selected signals during PD (e.g., CA1 and CA4), allowing the memory controller to trigger NT (non-target) ODT commands to be passed through and decoded by the non-target DRAM while the target DRAM remains in power down. For example, the DRAM can continue to monitor commands that utilize non-target ODT (e.g., via CA1 and CA4 or other signal lines) and will not exit PD if a valid NT ODT command is registered. In one embodiment, during powerdown, only NT ODT commands and PDX commands are legal.

In one embodiment, the DRAM continues to provide Rtt_Park termination if it is enabled in the DRAM mode register. To protect DRAM internal delay on decoding the PD commands, multiple Deselect commands can be provided after, with this timing period defined as tCPDED. In one embodiment, PDE will result in deactivation of command and address receivers after tCPDED has expired.

In one embodiment, a system defines two modes in the DRAM for powerdown. A first mode is powerdown without ODT functionality. The powerdown without ODT functionality can operate as defined above, where ODT signaling is not available. A host controller can use such a mode to put all ranks in powerdown, which can obviate the need for ODT functionality.

A second mode is powerdown with ODT functionality. For powerdown with ODT functionality, the host or memory controller can trigger such a mode when only some of the ranks will be put in powerdown, and ODT functionality can be applied to powered down DRAMs for accesses to other ranks. The host can signal the modes to the DRAM on CA 540 during the PDE command. In one embodiment, the bit state on the CA bus can determine which mode the DRAM goes into.

In one embodiment, the DRAM monitors one or more signal lines to maintain ODT functionality in powerdown. In one embodiment, CA bits CA1 and CA4 can be kept active when in powerdown. Alternatively, other bits can be selected, depending on the encoding selected. There is an advantage to selecting bits that enable the DRAM to differentiate various states related to the application of ODT. In one embodiment, the selected bits provide enough information from the DRAM commands to differentiate various states related to the application of ODT. For the example of maintaining CA1 and CA4 active in one embodiment, command encoding can indicate a NOP command with CA1, CA4='11'; a Read command or MRR (Mode Register Read) command with CA1, CA4='00'; a Write command or MRW (Mode Register Write) command with CA1, CA4='01'.

In one embodiment, in powerdown the DRAM will receive an active CS only to: 1) exit PD (e.g., if the CS is accompanied by a NOP command on the bus); 2) perform non-target termination for reads or MRR (e.g., if selected monitored CA bus signal lines indicate a read or MRR command on the CA bus with CS active for the both the first and second cycles); or, 3) perform non-target termination for writes for MRW (e.g., if selected monitored CA bus signal lines indicate a write or MRW command on the CA bus with CS active for both the first and second cycles). In one embodiment, CS must not go active to the DRAM for any other commands while in powerdown, as the powered down DRAM would not be able to decode the commands properly.

FIG. 6 is a representation of an embodiment of power down timing parameters. Diagram 600 provides one example of power-down entry definitions in accordance with an embodiment where the DRAM enters and exits power-down based on command encoding instead of a dedicated pin. Row 612 illustrates an Active status of the DRAM where one or more banks are open, and the DLL is on. The powerdown exit can be fast exit with tXP timing to any valid command for the fast exit. Similarly, row 614 illustrates a Precharged state of the DRAM where all banks are precharged, and the DLL is on. The powerdown exit can be fast exit with tXP timing to any valid command for the fast exit.

FIG. 7 is a block diagram of an embodiment of ODT control for a memory device without a clock enable signal. Circuit 700 provides one example of On-Die Termination (ODT) for a DRAM that does not have a dedicated pin to control ODT or to control low power state entry and exit. In one embodiment, ODT enables a DRAM to change termination resistance for each DQ. The DRAM can have separate ODT circuits such as 700 for each signal line of a data bus. In one embodiment, a DRAM includes termination such as the illustrated ODT for command signal lines in addition to those for data bus signal lines.

In one embodiment, the ODT feature is turned off and not supported in SR mode, but does have an optional mode in PD. Circuit 700 provides a simple functional representation of an example of DRAM ODT. Circuit 700 includes I/O 710, with I/O circuitry 720 to receive a signal, or to transmit or receive a signal. It will be understood that command signal lines are typically unidirectional from the memory controller to the memory device, and data bus signal lines are typically bidirectional. As illustrated, circuit 700 is specifically illustrated for DQ, DQS, DM, and TDQS signals.

I/O 710 can include ODT 730, which includes circuitry that can be illustrated as a simplified circuit with a switch S1 to selectively apply the termination, a variable impedance element RTT to apply differing impedance values in different conditions, and a source voltage VDDQ. ODT 730 can be selectively applied in accordance with mode register or other configuration. In one embodiment, the switch is enabled by the internal ODT control logic of the DRAM device. The controller internal to the DRAM can implement the ODT functions based on command decode, mode register settings, or other control information, or a combination. The value of RTT is determined by the settings of mode register bits.

In one embodiment, the DRAM applies ODT for DQS_t, DQS_c, and DM_n for ×4 and ×8 configurations (and TDQS_t, TDQS_c for ×8 configurations), when enabled via a mode register setting via read (for NT ODT usage) commands, write commands, or default parking value with MR setting. In one embodiment, for ×16 configuration, ODT is applied to each DQU, DQL, DQSU_t, DQSU_c, DQSL_t, DQSL_c, DMU_n, and DML_n signal. The ODT feature is designed to improve signal integrity of the memory channel by allowing the controller to independently change termination resistance for any or all DRAM devices. In addition to the control capability of the DQ ODT, independent timing support of the DQS ODT can be provided. Independent timing support can be provided even if the same RTT will be used. Such a capability can allow for adjusting the delay common in an unmatched architecture. In one embodiment, DQS RTT offset control mode is enabled via a mode register.

FIG. 8 is a representation of an embodiment of ODT termination states. Diagram 800 provides one example of termination states for ODT that can be in accordance with what is illustrated in circuit 700. Diagram 800 provides a table that maps various conditions with a termination state. In one embodiment, the conditions include a combination of command and mode register or other configuration settings. In diagram 800, the results indicate a termination state to apply for the condition, where the termination state can be different for target DRAMs than for non-target DRAMs. In one embodiment, ODT is applied to the DQ, DM, DQS_T/DQS_C, and TDQS_T/TDQS_C (×8 devices only) pins.

Diagram 800 illustrates a combination of command, and settings for various termination configuration types, whether the termination is disabled, enabled, or Don't Care. The various termination types can include RTT_Park which is a default or park termination setting, RTT_WR which is a write termination setting for a target DRAM, RTT_NOM_WR which is a write termination setting for a non-target DRAM, and RTT_NOM_RD which is a read termination setting for a non-target DRAM.

In accordance with row 812, if all termination settings are disabled, then for any command the DRAM can turn off ODT resulting in a Hi-Z or high impedance state. In accordance with row 814, if RTT_Park is enabled then for any non-termination command it does not matter what state the rest of the termination settings are in, the DRAM will apply RTT_Park if it is either a target or non-target DRAM. In accordance with section 816, diagram 800 illustrates various conditions for write commands, as set out in the table. In accordance with section 818, diagram 800 illustrates various conditions for read commands, as set out in the table.

In one embodiment, a DRAM ODT mode has 5 states, Data Termination Disable, RTT_WR, RTT_NOM_RD, RTT_NOM_WR and RTT_PARK. The ODT Mode can be enabled based on Mode Registers. In this case, the value of RTT can be determined by the settings of those bits.

In one embodiment, after entering SR mode, the DRAM automatically disables ODT termination and sets Hi-Z as the termination state regardless of these setting. In one embodiment, the controller can control each RTT condition with a WR/RD command and use of ODT offset control mode registers.

In one embodiment, a rank that is being written to provides RTT_WR termination and adjusts timing based on ODT control mode register settings. In one embodiment, a DRAM turns on RTT_NOM_RD if it sees CS asserted during the second pulse of a read command, except when ODT is disabled (which is done in one implementation via MR31). In one embodiment, a DRAM turns on RTT_NOM_WR if it sees a CS asserted during the second pulse of a write command, except when ODT is disabled (which is done in one implementation via MR31). In one embodiment, the DRAM applies RTT_PARK default parked termination value (which can be a value set via MR30) to be enabled when a read or write is not active.

In one embodiment, a DRAM driving data upon receiving a read command disables the termination after RL-X and stays off for a duration of BL/2+X clock cycles. X is dependent on the preamble. In one embodiment, the RTT values have priority as follows: 1. Data Termination Disable; 2. RTT_WR; 3. RTT_NOM_RD; 4. RTT_NOM_WR; 5. RTT_PARK. Such priority means if there is a write command, then the DRAM turns on RTT_WR and not RTT_NOM_WR or RTT_NOM_RD, and also if there is a read command, the DRAM disables data termination and goes into driving mode. If during the second pulse of a read or write command a CS enable is sent, then non-target ODT is enabled and the appropriate RTT_NOM_RD or RTT_NOM_WR is enabled for the non-target rank. Such operations provide additional and potentially different termination options for other ranks on the channel.

In one embodiment, when a read command is executed, the DRAM termination state of target rank will be Hi-Z for a defined period independent of configuration (e.g., mode register) setting of RTT_PARK/RTT_NOM_RD/RTT_NOM_WR. In one embodiment, if RTT_WR is enabled, RTT_WR will be activated by a write command for a defined period of time independent of MR settings of RTT_PARK/RTT_NOM. In one embodiment, if all RTT configurations are disabled, ODT receiver power is turned off to save power. In one embodiment, if RTT_PARK is enabled, DRAM RTT_PARK termination will be enabled while WR/MRW/RD/MRR are not being executed, where MRW in this instance refers to only MRW commands while in PDA mode. In one embodiment, when a non-target ODT command is executed and the RTT_NOM_WR or RTT_NOM_RD is disabled, the DRAM termination state of the non-target rank will be Hi-Z for a defined period, independent of the MR setting of RTT_PARK.

FIG. 9 is a representation of an embodiment of dynamic ODT timing parameters. Table 900 can represent latencies and timing parameters relevant for Dynamic ODT with 1tCK, or one clock cycle, preamble mode and CRC disabled for a DRAM that applies ODT without a dedicated ODT pin and without a dedicated CKE pin.

In certain application cases and to further enhance signal integrity on the data bus, it is desirable that the termination strength of the DRAM can be changed without issuing an MRW command. In one embodiment, such termination is supported by the "Dynamic ODT" feature as described as follows.

In one embodiment, the Dynamic ODT Mode is enabled if a mode register bit (e.g., a specified bit of MR2) is set to '1'. In one embodiment, four RTT values are available: RTT_NOM_RD, RTT_NOM_WR, RTT_PARK, and RTT_WR. In one embodiment, the value for RTT_NOM_RD is preselected via OP[5:3] in MR3. In one embodiment, the value for RTT_NOM_WR is preselected via OP[2:0] in MR3. In one embodiment, the value for RTT_WR is preselected via OP[5:3] in MR2. In one embodiment, the value for RTT_PARK is preselected via OP[2:0] in MR2.

In one embodiment, during operation without commands, the termination is controlled with nominal termination strength for all types (RTT_NOM_RD, RTT_NOM_WR, RTT_WR, and RTT_PARK) is selected, and RTT_NOM_RD and RTT_NOM_WR on/off timings are controlled via respective NT read and write command and latencies.

In one embodiment, when a write command (WR) is registered, the termination is controlled as follows. A latency ODTLon_WR after the write command, termination strength RTT_WR is selected. A latency ODTLoff_WR after the write command, termination strength RTT_WR is deselected. Table 900 includes specifics about an example of the termination control.

In accordance with row 912, an ODTLon_WR parameter can define ODT latency from a write command to RTT enable. In one embodiment the parameter is defined from a registering external write command to a change in RTT strength from a previous state to RTT_WR. The parameter can be equal to WL-2 clock cycles.

In accordance with row 914, an ODTLon_WR_NT parameter can define ODT latency from a non-target write command to RTT enable. In one embodiment the parameter is defined from a registering external write command to a change in RTT strength from a previous state to RTT_NOM_WR. The parameter can be equal to the ODTLon_WR parameter.

In accordance with row 916, an ODTLoff_WR parameter can define ODT latency from a write command to RTT disable. In one embodiment the parameter is defined from a registering external write command to a change in RTT strength from RTT_WR to a different RTT strength. The parameter value is to be defined.

In accordance with row 918, an ODTLoff_WR_NT parameter can define ODT latency from a non-target write command to RTT disable. In one embodiment the parameter is defined from a registering external write command to a change in RTT strength from RTT_NOM_WR to a different RTT strength. The parameter can be equal to the ODTLoff_WR parameter.

In accordance with row 920, an ODTLon_RD parameter can define ODT latency from a read command to RTT enable. In one embodiment the parameter is defined from a registering external read command to a change in RTT strength from a previous state to Hi-Z. The parameter value is to be defined.

In accordance with row 922, an ODTLon_RD_NT parameter can define ODT latency from a non-target read command to RTT enable. In one embodiment the parameter is defined from a registering external read command to a change in RTT strength from a previous state to RTT_NOM_RD. The parameter can be equal to the ODTLon_RD parameter.

In accordance with row 924, an ODTLoff_RD parameter can define ODT latency from a read command to RTT disable. In one embodiment the parameter is defined from a registering external read command to a change in RTT strength from Hi-Z to a different RTT strength. The parameter value is to be defined.

In accordance with row 926, an ODTLoff_RD_NT parameter can define ODT latency from a non-target read command to RTT disable. In one embodiment the parameter is defined from a registering external read command to a change in RTT strength from RTT_NOM_RD to a different RTT strength. The parameter can be equal to the ODTLoff_RD parameter.

In accordance with row 928, a tADC parameter can define an RTT change skew. In one embodiment the parameter is defined from transitioning from one RTT state to a next RTT state, and has a length to an RTT valid state. The parameter can have a minimum of 150 picoseconds (ps) to a maximum of 950 ps.

FIG. 10 is a representation of an embodiment of a command truth table. Table 1000 illustrates an example of command encoding. It will be understood that certain commands are multicycle, and others are single cycle. For example, as illustrated, all Read and Write commands include two cycles, or consecutive bursts of signals over the command bus, without intervening signaling occurring on the command bus. The second cycle can provide the data payload address information, and other signals regarding the performance of the access command. Thus, the memory device can execute the command at the address to either receive data on the data bus (for Writes) or place data on the data bus (for Reads).

In one embodiment, Read commands and MRR commands use the same termination and do not need to be differentiated by the DRAM in powerdown. Similarly, in one embodiment, Write commands and MRW commands use the same termination and do not need to be differentiated by the DRAM in powerdown. In one embodiment, the MRW commands only require termination when in per DRAM addressability (PDA) mode.

In one embodiment, proper termination on the bus by a DRAM may require information about the burst length, to know how long to apply the termination. In one embodiment, the burst length can either be fixed to 8 or 16 via MR bits, in which case the DRAM does not need burst length information with the command because it can be read from the mode register. In one embodiment, the burst length can be set to "Burst on the Fly" (e.g., by MR setting), in which case the burst length is set on a command-by-command basis. The best termination would be provided when the terminating DRAM knows the burst length as set by a BL bit in the command encoding. In one embodiment, the BL bit can be provided on the same selected CA signal lines used to detect Read and Write commands. For example, the Read or Write can be indicated on a first cycle of the command, and the BL can be indicated on one of the bits in the second cycle (e.g., on the second cycle of CA4 for commands requiring termination). In such an implementation, there are three bits of information for a DRAM to provide termination, and all three bits can be carried on two signal lines over the two cycles of the command.

In one embodiment, CS signaling that includes CS active on the first cycle only indicates a DRAM that is the target of the command. In one embodiment, CS signaling that includes CS active for the first and second cycles indicates the DRAM is not the target but should enable non-target termination (e.g., RTT_NOM). A CS signal may be active low. In one embodiment, CS signaling that includes CS not active for either the first or second cycles indicates the DRAM does not see the command and remains in Park termination (e.g., RTT_Park). Thus, CS signal encoding can trigger ODT.

For table 1000, the legend can be as follows: BG=bank group address; BA=bank address; R=row address; C=column address; BC8=burst chop 8; MRA=mode register address; OP=opcode; CID=chip identifier; CW=control word; H=logic high; L=logic low; X=Don't Care or it does not matter what state the signal has, and the signal may be floated; and, V =valid meaning any valid signal state, or more specifically, either high or low.

In one embodiment, as set out in table 1000, in one embodiment, a self-refresh entry command (SRE) can include a CS=L with CA0:CA5 having a bit pattern of '11101b', where 1=H and 0=L. In one embodiment, SRE can also have a CA10=L, with all other signals simply having a valid state. It will be observed that powerdown entry command (PDE) has the same encoding as SRE with the exception of CA10=H. PDE can also signal the ODT state with CA11, with CA11=L triggering ODT to allow ODT to persist when the device is in powerdown state.

In one embodiment, SRX is signaled by a transition of CS, as described above. Thus, there is not necessarily a specific command for SRX, but the command encoding can be held at DES in one embodiment. In one embodiment, PDX is signaled with a NOP command. In one embodiment, DES can allow all command signals to be floated. To the extent that the command signal lines are not floated, the only difference between NOP and DES is that for NOP the memory controller pulses CS low, while for DES the memory controller keeps CS high. Thus, in one embodiment, the command encoding for PDX can be considered either a NOP or a DES with CS low. The command encoding for CA1 and CA4 can identify access command and distinguish between reads and write, as previously described. Thus, a device in powerdown can monitor the signals to determine ODT settings in PD.

Figure 11A:
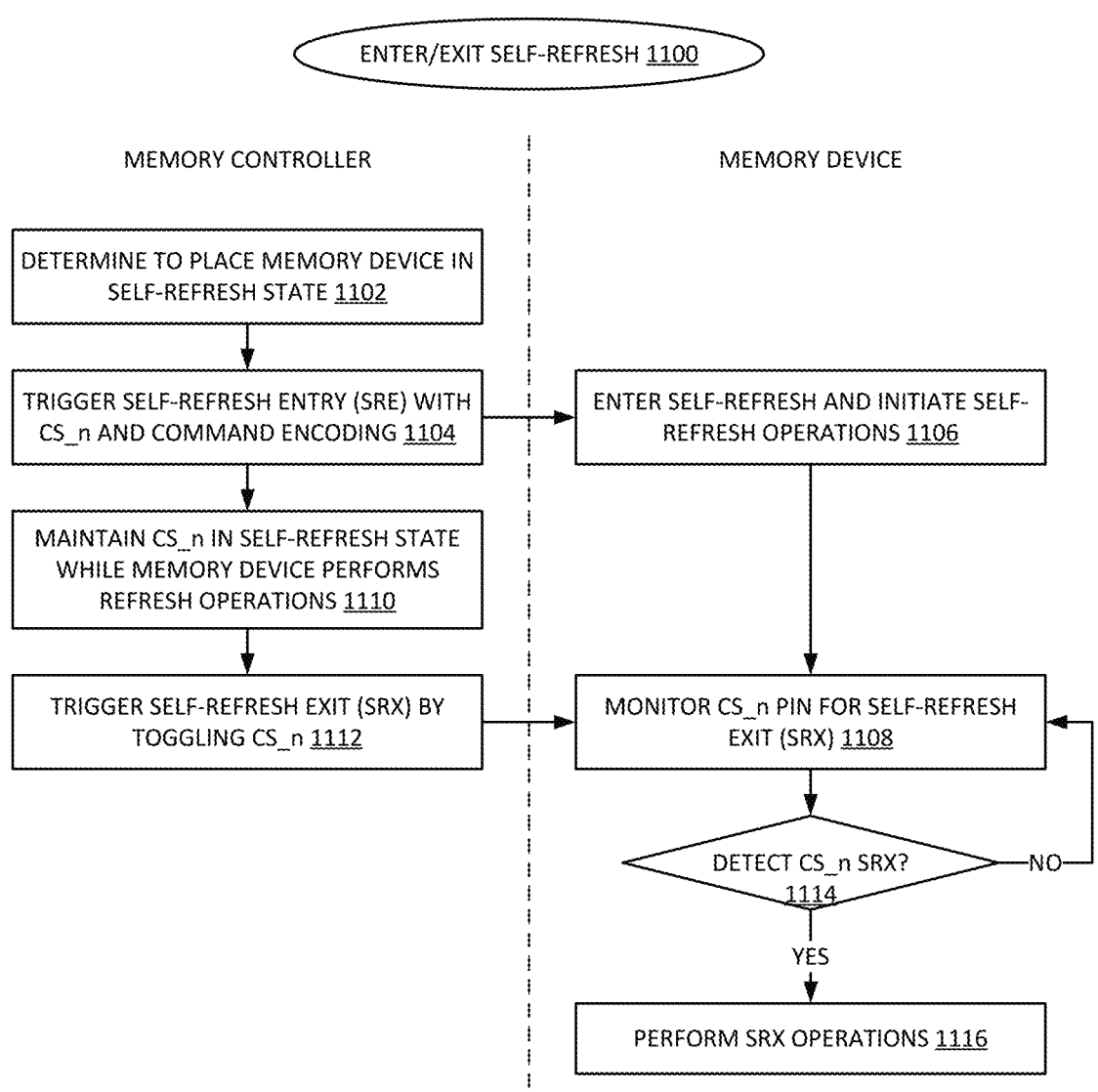
FIG. 11A is a flow diagram of an embodiment of a process for entry and exit from self-refresh without a clock enable signal.

FIG. 11A is a flow diagram of an embodiment of a process for entry and exit from self-refresh without a clock enable signal. Process 1100 provides an example of entering and exiting self-refresh based on command encoding. In one embodiment, the memory controller determines to place a memory device or DRAM in a self-refresh state, 1102. In one embodiment, the memory controller triggers SRE (self-refresh entry) with a CS_n signal and command encoding on command signal lines, 1104. In response to the SRE command, the memory device can enter self-refresh and initiate self-refresh operations, 1106. In one embodiment, the memory device performs self-refresh operations while monitoring a CS_n pin for a self-refresh exit (SRX) indication, 1108.

In one embodiment, the memory controller maintains the CS_n signal at a specific logic level (e.g., logic LOW) for the entire time the memory device is in the self-refresh state and performs self-refresh operations, 1110. When it is time to take the memory device out of self-refresh, in one embodiment, the memory controller triggers SRX (self-refresh exit) by toggling the CS_n signal, 1112. The memory device can detect the toggling of CS_n to indicate SRX, 1114 YES branch, and perform operations to exit self-refresh, 1116. If no SRX indication is received, 1114 NO branch, the memory device can remain in self-refresh and monitor the CS_n signal line, 1108.

Figure 11B:
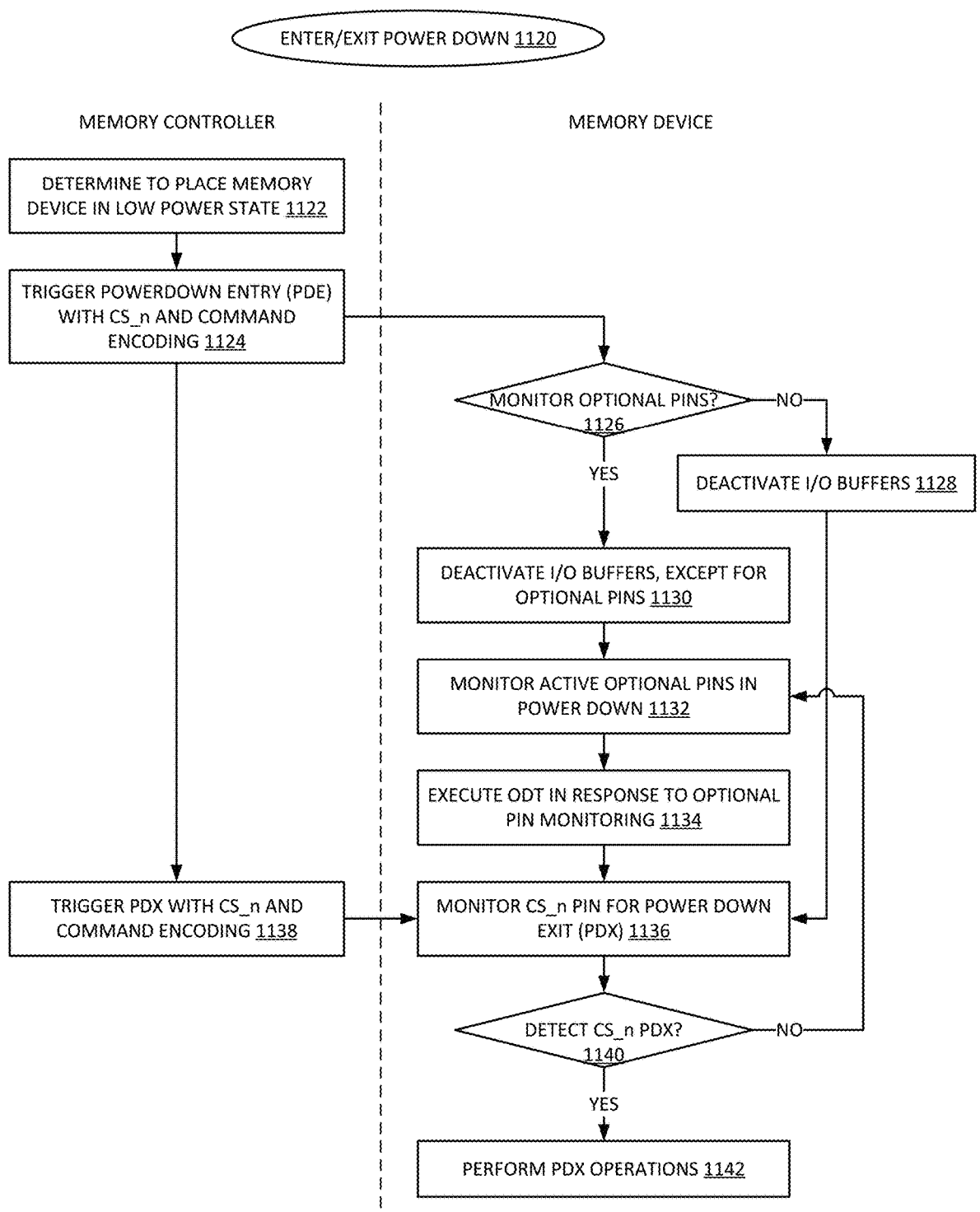
FIG. 11B is a flow diagram of an embodiment of a process for entry and exit from power down without a clock enable signal.

FIG. 11B is a flow diagram of an embodiment of a process for entry and exit from power down without a clock enable signal. Process 1120 provides an example of entering and exiting power down based on command encoding. In one embodiment, the memory controller determines to place a memory device or DRAM in a low power or power down state, 1122. In one embodiment, the memory controller triggers PDE (power down entry) with a CS_n signal and command encoding on command signal lines, 1124. In response to the PDE command, the memory device can monitor one or more pins in the power down state. If the memory is not to monitor I/O pins, 1126 NO branch, the memory device can deactivate I/O buffers, 1128, and monitor a CS_n pin for a power down exit (PDX) indication, 1136.

In one embodiment, the memory device is to monitor optional I/O pins, 1126 YES branch. In one embodiment, the memory device deactivates all I/O buffers except for the optional pins to be monitored while in power down, 1130. The memory device can monitor the active optional pins, where "optional" refers to a pin or pins that can trigger a function other than exit from power down, 1132. In one embodiment, the memory device monitors pins that can indicate when the memory device is a non-target memory for a read or write command. The detection of such an indication can include monitoring CS with the other pins. Thus, the memory device can execute ODT operations in response to optional pin monitoring, 1134. While an example of ODT is provided, in one embodiment, other functions may be provided.

The memory device can monitor the CS_n pin for a power down exit (PDX) indication, 1136. The memory controller determines when it is time to take the memory device out of power down, and in one embodiment, the memory controller triggers PDX (power down exit) by toggling the CS_n signal and providing a command encoding, 1138. The memory device can detect the toggling of CS_n and command encoding to indicate PDX, 1140 YES branch, and perform operations to exit power down, 1142. If no PDX indication is received, 1140 NO branch, the memory device can remain in power down mode and continue to monitor one or more optional pins and monitor the CS_n signal line, 1132, 1134, 1136.

Figure 12:
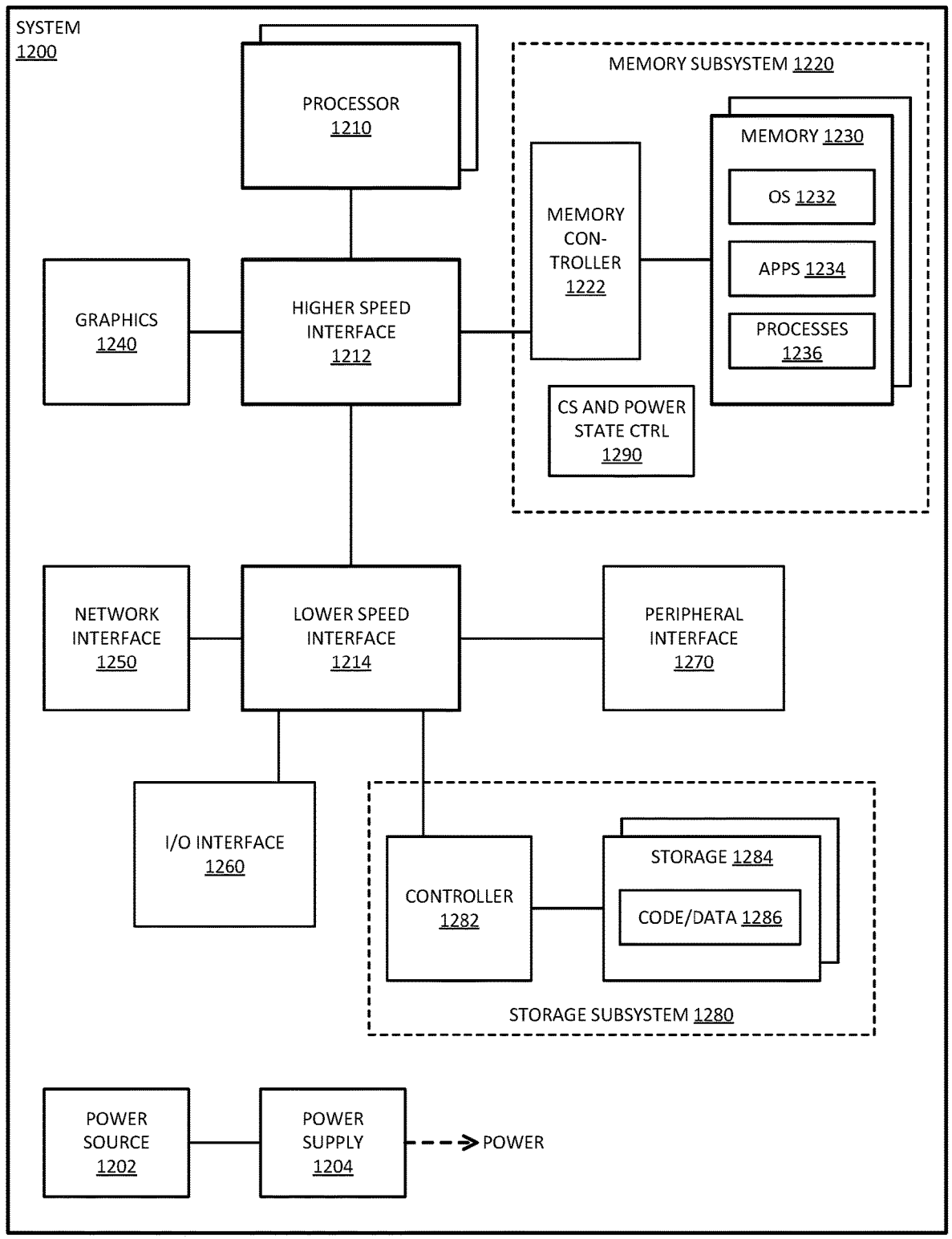
FIG. 12 is a block diagram of an embodiment of a computing system in which combined control over chip select and power management state can be implemented.

FIG. 12 is a block diagram of an embodiment of a computing system in which combined control over chip select and power management state can be implemented. System 1200 represents a computing device in accordance with any embodiment described herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

System 1200 includes processor 1210, which provides processing, operation management, and execution of instructions for system 1200. Processor 1210 can include any type of microprocessor, central processing unit (CPU), graphics processing unit (GPU), processing core, or other processing hardware to provide processing for system 1200, or a combination of processors. Processor 1210 controls the overall operation of system 1200, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 1200 includes interface 1212 coupled to processor 1210, which can represent a higher speed interface or a high throughput interface for system components that needs higher bandwidth connections, such as memory subsystem 1220 or graphics interface components 1240. Interface 1212 represents an interface circuit, which can be a standalone component or integrated onto a processor die. Where present, graphics interface 1240 interfaces to graphics components for providing a visual display to a user of system 1200. In one embodiment, graphics interface 1240 can drive a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, the display can include a touchscreen display. In one embodiment, graphics interface 1240 generates a display based on data stored in memory 1230 or based on operations executed by processor 1210 or both.

Memory subsystem 1220 represents the main memory of system 1200, and provides storage for code to be executed by processor 1210, or data values to be used in executing a routine. Memory subsystem 1220 can include one or more memory devices 1230 such as read-only memory (ROM), flash memory, one or more varieties of random access memory (RAM) such as DRAM, or other memory devices, or a combination of such devices. Memory 1230 stores and hosts, among other things, operating system (OS) 1232 to provide a software platform for execution of instructions in system 1200. Additionally, applications 1234 can execute on the software platform of OS 1232 from memory 1230. Applications 1234 represent programs that have their own operational logic to perform execution of one or more functions. Processes 1236 represent agents or routines that provide auxiliary functions to OS 1232 or one or more applications 1234 or a combination. OS 1232, applications 1234, and processes 1236 provide software logic to provide functions for system 1200. In one embodiment, memory subsystem 1220 includes memory controller 1222, which is a memory controller to generate and issue commands to memory 1230. It will be understood that memory controller 1222 could be a physical part of processor 1210 or a physical part of interface 1212. For example, memory controller 1222 can be an integrated memory controller, integrated onto a circuit with processor 1210.

While not specifically illustrated, it will be understood that system 1200 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one embodiment, system 1200 includes interface 1214, which can be coupled to interface 1212. Interface 1214 can be a lower speed interface than interface 1212. In one embodiment, interface 1214 represents an interface circuit, which can include standalone components and integrated circuitry. In one embodiment, multiple user interface components or peripheral components, or both, couple to interface 1214. Network interface 1250 provides system 1200 the ability to communicate with remote devices (e.g., servers or other computing devices) over one or more networks. Network interface 1250 can include an Ethernet adapter, wireless interconnection components, cellular network interconnection components, USB (universal serial bus), or other wired or wireless standards-based or proprietary interfaces. Network interface 1250 can exchange data with a remote device, which can include sending data stored in memory or receiving data to be stored in memory.

In one embodiment, system 1200 includes one or more input/output (I/O) interface(s) 1260. I/O interface 1260 can include one or more interface components through which a user interacts with system 1200 (e.g., audio, alphanumeric, tactile/touch, or other interfacing). Peripheral interface 1270 can include any hardware interface not specifically mentioned above. Peripherals refer generally to devices that connect dependently to system 1200. A dependent connection is one where system 1200 provides the software platform or hardware platform or both on which operation executes, and with which a user interacts.

In one embodiment, system 1200 includes storage subsystem 1280 to store data in a nonvolatile manner. In one embodiment, in certain system implementations, at least certain components of storage 1280 can overlap with components of memory subsystem 1220. Storage subsystem 1280 includes storage device(s) 1284, which can be or include any conventional medium for storing large amounts of data in a nonvolatile manner, such as one or more magnetic, solid state, or optical based disks, or a combination. Storage 1284 holds code or instructions and data 1286 in a persistent state (i.e., the value is retained despite interruption of power to system 1200). Storage 1284 can be generically considered to be a "memory," although memory 1230 is typically the executing or operating memory to provide instructions to processor 1210. Whereas storage 1284 is nonvolatile, memory 1230 can include volatile memory (i.e., the value or state of the data is indeterminate if power is interrupted to system 1200). In one embodiment, storage subsystem 1280 includes controller 1282 to interface with storage 1284. In one embodiment controller 1282 is a physical part of interface 1214 or processor 1210, or can include circuits or logic in both processor 1210 and interface 1214.

Power source 1202 provides power to the components of system 1200. More specifically, power source 1202 typically interfaces to one or multiple power supplies 1204 in system 1200 to provide power to the components of system 1200. In one embodiment, power supply 1204 includes an AC to DC (alternating current to direct current) adapter to plug into a wall outlet. Such AC power can be renewable energy (e.g., solar power) power source 1202. In one embodiment, power source 1202 includes a DC power source, such as an external AC to DC converter. In one embodiment, power source 1202 or power supply 1204 includes wireless charging hardware to charge via proximity to a charging field. In one embodiment, power source 1202 can include an internal battery or fuel cell source.

In one embodiment, memory subsystem 1220 includes multiple volatile memory devices 1230, which can be placed in a self-refresh state or a powerdown state. In one embodiment, system 1200 includes chip select (CS) and power state control 1290, which represents one or more mechanisms to control entry into and exit from self-refresh and powerdown states based on command encoding without a dedicated power state control pin, in accordance with any embodiment described herein. In one embodiment, memory controller 1222 triggers a specific memory device to enter and exit self-refresh or to enter and exit powerdown without a clock enable or other dedicated power state control signal line. Instead of being controlled by a single pin, or by a clock enable pin, the entry and exit of lower power modes self-refresh and powerdown are controlled by command encoding. In one embodiment, specific command encoding and monitoring of selected command signal lines can trigger ODT in a low power state.

Figure 13:
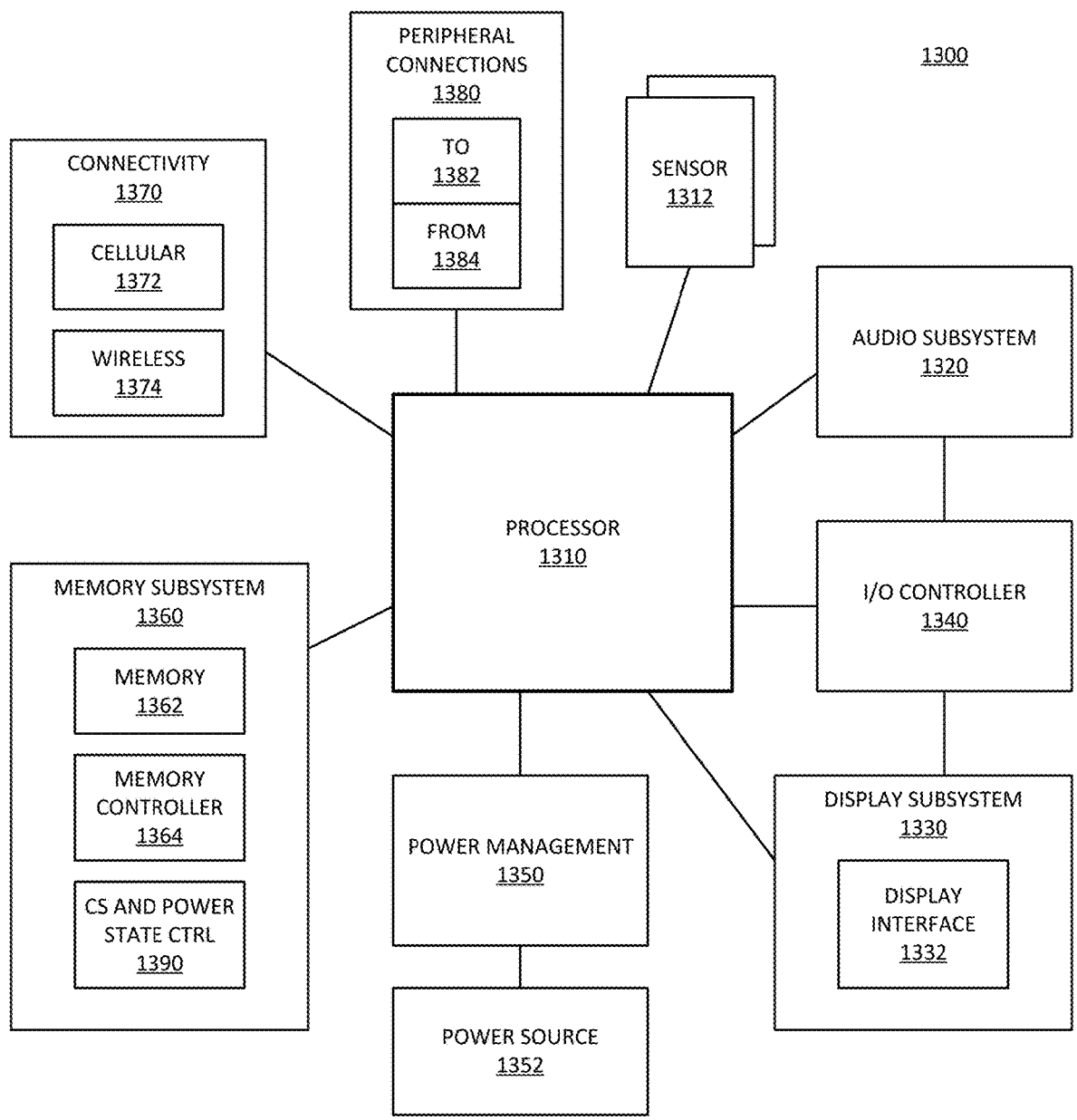
FIG. 13 is a block diagram of an embodiment of a mobile device in which combined control over chip select and power management state can be implemented.

FIG. 13 is a block diagram of an embodiment of a mobile device in which combined control over chip select and power management state can be implemented. Device 1300 represents a mobile computing device, such as a computing tablet, a mobile phone or smartphone, a wireless-enabled e-reader, wearable computing device, an internet-of-things device or other mobile device, or an embedded computing device. It will be understood that certain of the components are shown generally, and not all components of such a device are shown in device 1300.

Device 1300 includes processor 1310, which performs the primary processing operations of device 1300. Processor 1310 can include one or more physical devices, such as microprocessors, application processors, microcontrollers, programmable logic devices, or other processing means. The processing operations performed by processor 1310 include the execution of an operating platform or operating system on which applications and device functions are executed. The processing operations include operations related to I/O (input/output) with a human user or with other devices, operations related to power management, operations related to connecting device 1300 to another device, or a combination. The processing operations can also include operations related to audio I/O, display I/O, or other interfacing, or a combination. Processor 1310 can execute data stored in memory. Processor 1310 can write or edit data stored in memory.

In one embodiment, device 1300 includes one or more sensors 1312. Sensors 1312 represent embedded sensors or interfaces to external sensors, or a combination. Sensors 1312 enable device 1300 to monitor or detect one or more conditions of an environment or a device in which device 1300 is implemented. Sensors 1312 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1312 can also include sensors for biometric systems such as fingerprint recognition systems, face detection or recognition systems, or other systems that detect or recognize user features. Sensors 1312 should be understood broadly, and not limiting on the many different types of sensors that could be implemented with device 1300. In one embodiment, one or more sensors 1312 couples to processor 1310 via a frontend circuit integrated with processor 1310. In one embodiment, one or more sensors 1312 couples to processor 1310 via another component of device 1300.

In one embodiment, device 1300 includes audio subsystem 1320, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1300, or connected to device 1300. In one embodiment, a user interacts with device 1300 by providing audio commands that are received and processed by processor 1310.

Display subsystem 1330 represents hardware (e.g., display devices) and software components (e.g., drivers) that provide a visual display for presentation to a user. In one embodiment, the display includes tactile components or touchscreen elements for a user to interact with the computing device. Display subsystem 1330 includes display interface 1332, which includes the particular screen or hardware device used to provide a display to a user. In one embodiment, display interface 1332 includes logic separate from processor 1310 (such as a graphics processor) to perform at least some processing related to the display. In one embodiment, display subsystem 1330 includes a touchscreen device that provides both output and input to a user. In one embodiment, display subsystem 1330 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem includes a touchscreen display. In one embodiment, display subsystem 1330 generates display information based on data stored in memory or based on operations executed by processor 1310 or both.

I/O controller 1340 represents hardware devices and software components related to interaction with a user. I/O controller 1340 can operate to manage hardware that is part of audio subsystem 1320, or display subsystem 1330, or both. Additionally, I/O controller 1340 illustrates a connection point for additional devices that connect to device 1300 through which a user might interact with the system. For example, devices that can be attached to device 1300 might include microphone devices, speaker or stereo systems, video systems or other display device, keyboard or keypad devices, or other I/O devices for use with specific applications such as card readers or other devices.

As mentioned above, I/O controller 1340 can interact with audio subsystem 1320 or display subsystem 1330 or both. For example, input through a microphone or other audio device can provide input or commands for one or more applications or functions of device 1300. Additionally, audio output can be provided instead of or in addition to display output. In another example, if display subsystem includes a touchscreen, the display device also acts as an input device, which can be at least partially managed by I/O controller 1340. There can also be additional buttons or switches on device 1300 to provide I/O functions managed by I/O controller 1340.

In one embodiment, I/O controller 1340 manages devices such as accelerometers, cameras, light sensors or other environmental sensors, gyroscopes, global positioning system (GPS), or other hardware that can be included in device 1300, or sensors 1312. The input can be part of direct user interaction, as well as providing environmental input to the system to influence its operations (such as filtering for noise, adjusting displays for brightness detection, applying a flash for a camera, or other features).

In one embodiment, device 1300 includes power management 1350 that manages battery power usage, charging of the battery, and features related to power saving operation. Power management 1350 manages power from power source 1352, which provides power to the components of device 1300. In one embodiment, power source 1352 includes an AC to DC (alternating current to direct current) adapter to plug into a wall outlet. Such AC power can be renewable energy (e.g., solar power, motion based power). In one embodiment, power source 1352 includes only DC power, which can be provided by a DC power source, such as an external AC to DC converter. In one embodiment, power source 1352 includes wireless charging hardware to charge via proximity to a charging field. In one embodiment, power source 1352 can include an internal battery or fuel cell source.

Memory subsystem 1360 includes memory device(s) 1362 for storing information in device 1300. Memory subsystem 1360 can include nonvolatile (state does not change if power to the memory device is interrupted) or volatile (state is indeterminate if power to the memory device is interrupted) memory devices, or a combination. Memory 1360 can store application data, user data, music, photos, documents, or other data, as well as system data (whether long-term or temporary) related to the execution of the applications and functions of device 1300. In one embodiment, memory subsystem 1360 includes memory controller 1364 (which could also be considered part of the control of device 1300, and could potentially be considered part of processor 1310). Memory controller 1364 includes a scheduler to generate and issue commands to control access to memory device 1362.

Connectivity 1370 includes hardware devices (e.g., wireless or wired connectors and communication hardware, or a combination of wired and wireless hardware) and software components (e.g., drivers, protocol stacks) to enable device 1300 to communicate with external devices. The external device could be separate devices, such as other computing devices, wireless access points or base stations, as well as peripherals such as headsets, printers, or other devices. In one embodiment, device 1300 exchanges data with an external device for storage in memory or for display on a display device. The exchanged data can include data to be stored in memory, or data already stored in memory, to read, write, or edit data.

Connectivity 1370 can include multiple different types of connectivity. To generalize, device 1300 is illustrated with cellular connectivity 1372 and wireless connectivity 1374. Cellular connectivity 1372 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1374 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1380 include hardware interfaces and connectors, as well as software components (e.g., drivers, protocol stacks) to make peripheral connections. It will be understood that device 1300 could both be a peripheral device ("to" 1382) to other computing devices, as well as have peripheral devices ("from" 1384) connected to it. Device 1300 commonly has a "docking" connector to connect to other computing devices for purposes such as managing (e.g., downloading, uploading, changing, synchronizing) content on device 1300. Additionally, a docking connector can allow device 1300 to connect to certain peripherals that allow device 1300 to control content output, for example, to audiovisual or other systems.

In addition to a proprietary docking connector or other proprietary connection hardware, device 1300 can make peripheral connections 1380 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 1360 includes multiple volatile memory devices 1362, which can be placed in a self-refresh state or a powerdown state. In one embodiment, device 1300 includes chip select (CS) and power state control 1390, which represents one or more mechanisms to control entry into and exit from self-refresh and powerdown states based on command encoding without a dedicated power state control pin, in accordance with any embodiment described herein. In one embodiment, memory controller 1364 triggers a specific memory device to enter and exit self-refresh or to enter and exit powerdown without a clock enable or other dedicated power state control signal line. Instead of being controlled by a single pin, or by a clock enable pin, the entry and exit of lower power modes self-refresh and powerdown are controlled by command encoding. In one embodiment, specific command encoding and monitoring of selected command signal lines can trigger ODT in a low power state.

In one aspect, a dynamic random access memory (DRAM) device includes: a memory array including addressable memory locations; and I/O (input/output) circuitry including an interface to a command bus including a chip select (CS) signal line and excluding a clock enable (CKE) signal line; wherein a logic transition of the CS signal line is to trigger a low power mode, in connection with a command encoding of the command bus.

In one embodiment, the logic transition of the CS signal line comprises the CS signal line being driven low. In one embodiment, the CS signal line is to be held low until a command to trigger exit of the low power mode. In one embodiment, the low power mode comprises powerdown, and the command encoding includes either a power down entry command encoding or power down exit command encoding. In one embodiment, the low power mode comprises self-refresh, and the command encoding includes either a self-refresh entry command encoding or self-refresh exit command encoding. In one embodiment, the DRAM device is to monitor the CS signal line and only selected signal lines of the command bus while in the low power mode. In one embodiment, the DRAM device is to monitor the CS signal line and two other signal lines of the command bus. In one embodiment, the DRAM device is to monitor the CS signal line and selected signal lines of the command bus while in the low power mode to identify an on-die termination (ODT) trigger. In one embodiment, the DRAM device is to monitor the CS signal line for a multicycle command, wherein the DRAM device is identified as a non-target device if the CS signal line is driven low for both first and second command cycles. In one embodiment, the DRAM device comprises a synchronous dynamic random access memory (SDRAM) device compatible with a double data rate (DDR) standard. In one embodiment, the DRAM device comprises an SDRAM device compatible with a double data rate version 5 (DDR5) standard.

In one aspect, a system with a memory subsystem includes: a memory controller; and multiple dynamic random access memory (DRAM) devices, wherein a DRAM device includes a DRAM device in accordance with any embodiment the preceding two paragraphs. In one embodiment, the system further comprising one or more of: at least one processor communicatively coupled to the memory controller; a display communicatively coupled to at least one processor; a network interface communicatively coupled to at least one processor; or a battery to power the system.

In one aspect, a method for initializing a dynamic random access memory (DRAM) device includes: identifying a transition of a chip select (CS) signal line in an interface to a command bus including a CS signal line and excluding a clock enable (CKE) signal line; identifying a command encoding of the command bus associated with entering a low power mode; and responsive to identifying the transition on the CS signal line in connection with the command encoding, entering a low power mode.

In one embodiment, identifying the transition of the CS signal line comprises identifying the CS signal line being driven low. In one embodiment, the CS signal line is to be held low until a command to trigger exit of the low power mode. In one embodiment, the low power mode comprises powerdown, and the command encoding includes either a power down entry command encoding or power down exit command encoding. In one embodiment, the low power mode comprises self-refresh, and the command encoding includes either a self-refresh entry command encoding or self-refresh exit command encoding. In one embodiment, further comprising monitor the CS signal line and only selected signal lines of the command bus while in the low power mode. In one embodiment, the monitoring comprises monitoring the CS signal line and two other signal lines of the command bus. In one embodiment, the monitoring comprises monitoring the CS signal line and selected signal lines of the command bus while in the low power mode to identify an on-die termination (ODT) trigger. In one embodiment, the monitoring comprises monitoring the CS signal line for a multicycle command, wherein the DRAM device is identified as a non-target device if the CS signal line is driven low for both first and second command cycles. In one embodiment, the DRAM device comprises a synchronous dynamic random access memory (SDRAM) device compatible with a double data rate (DDR) standard. In one embodiment, the DRAM device comprises an SDRAM device compatible with a double data rate version 5 (DDR5) standard.

In one aspect, a memory controller includes: command logic to generate commands to trigger an associated dynamic random access memory (DRAM) device to enter a low power mode; and I/O (input/output) circuitry including an interface to a command bus including a chip select (CS) signal line and excluding a clock enable (CKE) signal line, the I/O circuitry to toggle the CS signal line and drive a command encoding on the command bus to trigger a low power mode of the DRAM device.

In one embodiment, the I/O circuitry is to drive the CS signal line low. In one embodiment, the I/O circuitry is to drive the CS signal line low until a command to trigger exit from the low power mode. In one embodiment, the low power mode comprises powerdown, and the command encoding includes either a power down entry command encoding or power down exit command encoding. In one embodiment, the low power mode comprises self-refresh, and the command encoding includes either a self-refresh entry command encoding or self-refresh exit command encoding. In one embodiment, the I/O circuitry is to send commands to the DRAM device with the CS signal line and only selected signal lines of the command bus monitored by the DRAM device while in the low power mode. In one embodiment, the I/O circuitry is to send commands via the CS signal line and two other signal lines of the command bus. In one embodiment, the I/O circuitry is to send an on-die termination (ODT) trigger to the DRAM device via the CS signal line and selected signal lines of the command bus. In one embodiment, the I/O circuitry is to send a multicycle command, wherein the DRAM device is identified as a non-target device if the CS signal line is driven low for both first and second command cycles. In one embodiment, the DRAM device comprises a synchronous dynamic random access memory (SDRAM) device compatible with a double data rate (DDR) standard. In one embodiment, the DRAM device comprises an SDRAM device compatible with a double data rate version 5 (DDR5) standard.

In one aspect, a system with a memory subsystem includes: multiple dynamic random access memory (DRAM) devices; and a memory controller in accordance with any embodiment of a memory controller of the preceding two paragraphs. In one embodiment, the system further comprising one or more of: at least one processor communicatively coupled to the memory controller; a display communicatively coupled to at least one processor; a network interface communicatively coupled to at least one processor; or a battery to power the system.

In one aspect, a method for initializing a dynamic random access memory (DRAM) device includes: generating commands to trigger an associated dynamic random access memory (DRAM) device to enter a low power mode; toggling a chip select (CS) signal line of a command bus that includes a CS signal line and excludes a clock enable (CKE) signal line; and driving a command encoding on the command bus to trigger a low power mode of the DRAM device.

In one embodiment, toggling the CS signal line comprises driving the CS signal line low. In one embodiment, further comprising holding the CS signal line low until a command to trigger exit of the low power mode. In one embodiment, the low power mode comprises powerdown, and the command encoding includes either a power down entry command encoding or power down exit command encoding. In one embodiment, the low power mode comprises self-refresh, and the command encoding includes either a self-refresh entry command encoding or self-refresh exit command encoding. In one embodiment, further comprising sending commands via only the CS signal line and selected signal lines of the command bus while the DRAM device is in the low power mode. In one embodiment, sending commands via only the CS signal line and selected signal lines of the command bus sending command via the CS signal line and only two other signal lines of the command bus monitored by the DRAM device while in the low power mode. In one embodiment, sending the command comprises sending commands via the CS signal line and two other signal lines of the command bus. In one embodiment, sending the command comprises sending an on-die termination (ODT) trigger to the DRAM device via the CS signal line and selected signal lines of the command bus. In one embodiment, sending the ODT trigger comprises sending a multicycle command, wherein the DRAM device is identified as a non-target device if the CS signal line is driven low for both first and second command cycles. In one embodiment, the DRAM device comprises a synchronous dynamic random access memory (SDRAM) device compatible with a double data rate (DDR) standard. In one embodiment, the DRAM device comprises an SDRAM device compatible with a double data rate version 5 (DDR5) standard.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A dynamic random access memory (DRAM) device, comprising:
   a memory array including multiple memory locations; and
   I/O (input/output) circuitry including an interface to a command bus including a chip select (CS) signal line and excluding a clock enable (CKE) signal line;
   wherein a logic transition of the CS signal line is to trigger a low power mode, with the CS signal line driven high in connection with a command encoding of the command bus at a clock edge.

2. The DRAM device of claim 1, wherein the low power mode comprises powerdown, and the command encoding includes power down entry command encoding.

3. The DRAM device of claim 2, wherein the DRAM device is to apply on-die termination (ODT) as a non-target device in powerdown.

4. The DRAM device of claim 1, wherein the low power mode comprises self-refresh, and the command encoding includes self-refresh entry command encoding.

5. The DRAM device of claim 1, wherein the low power mode comprises self-refresh, and further comprising receipt of a self-refresh exit command encoding to trigger exit from self-refresh.

6. The DRAM device of claim 1, wherein the DRAM device comprises a synchronous dynamic random access memory (SDRAM) device compatible with a low power double data rate version 5 (LPDDR5) standard.

7. A system with a memory subsystem, comprising:
   a memory controller; and
   multiple dynamic random access memory (DRAM) devices, wherein a DRAM device includes
   a memory array including multiple memory locations; and
   I/O (input/output) circuitry including an interface to a command bus including a chip select (CS) signal line and excluding a clock enable (CKE) signal line;
   wherein a logic transition of the CS signal line is to trigger a low power mode, with the CS signal line driven high in connection with a command encoding of the command bus at a clock edge.

8. The system of claim 7, wherein the low power mode comprises powerdown, and the command encoding includes either a power down entry command encoding or power down exit command encoding.

9. The system of claim 8, wherein the DRAM device is to apply on-die termination (ODT) as a non-target device in powerdown.

10. The system of claim 7, wherein the low power mode comprises self-refresh, and the command encoding includes self-refresh entry command encoding.

11. The system of claim 7, wherein the low power mode comprises self-refresh, and further comprising receipt of a self-refresh exit command encoding to trigger exit from self-refresh.

12. The system of claim 7, wherein the DRAM device comprises a synchronous dynamic random access memory (SDRAM) device compatible with a low power double data rate version 5 (LPDDR5) standard.

13. The system of claim 7, further comprising one or more of:
   at least one processor communicatively coupled to the memory controller;
   a display communicatively coupled to at least one processor;
   a network interface communicatively coupled to at least one processor; or
   a battery to power the system.

14. A memory controller, comprising:
   command logic to generate commands to trigger an associated dynamic random access memory (DRAM) device to enter a low power mode; and
   I/O (input/output) circuitry including an interface to a command bus including a chip select (CS) signal line and excluding a clock enable (CKE) signal line, the I/O circuitry to toggle the CS signal line to a logic high, and to drive a command encoding on the command bus at a clock edge, to trigger a low power mode of the DRAM device.

15. The memory controller of claim 14, wherein the I/O circuitry is encode the command bus with either a power down entry command encoding or power down exit command encoding.

16. The memory controller of claim 15, wherein the DRAM device is to apply on-die termination (ODT) as a non-target device in powerdown.

17. The memory controller of claim 14, wherein the low power mode comprises self-refresh, and the command encoding includes self-refresh entry command encoding.

18. The memory controller of claim 14, wherein the low power mode comprises self-refresh, and further comprising receipt of a self-refresh exit command encoding to trigger exit from self-refresh.

19. The memory controller of claim 14, wherein the DRAM device comprises a synchronous dynamic random access memory (SDRAM) device compatible with a low power double data rate version 5 (LPDDR5) standard.

* * * * *